US010018686B1

(12) United States Patent
Bickford et al.

(10) Patent No.: US 10,018,686 B1
(45) Date of Patent: Jul. 10, 2018

(54) ULTRA-LOW NOISE SENSOR FOR MAGNETIC FIELDS

(71) Applicant: The Charles Stark Draper Laboratory, Inc., Cambridge, MA (US)

(72) Inventors: James Alan Bickford, Winchester, MA (US); Jonathan Jay Bernstein, Medfield, MA (US); Marc Steven Weinberg, Needham, MA (US); Amy Elizabeth Duwel, Cambridge, MA (US); Richard David Elliott, III, North Reading, MA (US); Ronald Edmund Gagnon, Jr., North Grafton, MA (US); Joseph Michael Kinast, Cambridge, MA (US); John Joseph LeBlanc, North Andover, MA (US); Thomas Francis Marinis, Jr., Haverhill, MA (US); Michael Joseph Tomaino-Iannucci, Somerville, MA (US); William Joseph Trinkle, Jr., Arlington, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 152 days.

(21) Appl. No.: 14/919,527

(22) Filed: Oct. 21, 2015

(51) Int. Cl.
*G01R 33/028* (2006.01)
*G01R 33/038* (2006.01)
(Continued)

(52) U.S. Cl.
CPC ..... *G01R 33/0286* (2013.01); *G01R 33/0047* (2013.01); *G01R 33/035* (2013.01); *G01R 33/038* (2013.01)

(58) Field of Classification Search
CPC .............. G01R 33/0047; G01R 33/035; G01R 33/038; G01R 33/02; G01R 33/0286;
(Continued)

(56) References Cited

U.S. PATENT DOCUMENTS

| 4,380,735 A | 4/1983 | Bell |
| 4,670,092 A | 6/1987 | Motamedi |

(Continued)

FOREIGN PATENT DOCUMENTS

| CN | 102879655 A | 1/2013 |
| DE | 102014204721 A1 | 9/2015 |

(Continued)

OTHER PUBLICATIONS

Bernstein, J., R. Miller, W. Kelley, and P. Ward, "Low-Noise MEMS Vibration Sensor for Geophysical Applications," Journal of Microelectromechanical Systems, vol. 8, No. 4, pp. 433-438, 2009.

(Continued)

*Primary Examiner* — Tung X Nguyen
*Assistant Examiner* — Lee Rodak
(74) *Attorney, Agent, or Firm* — Lando & Anastasi, LLP

(57) ABSTRACT

An ultra-low noise sensor for magnetic fields comprises a mechanically resonant structure having a magnetized proof mass. The displacement of the proof mass due to a magnetic field provides a high resolution and highly amplified measurement of magnetic field fluctuations near the resonance frequency. A flux modulator may be used with the resonant structure to amplify magnetic fluctuations in a non-resonant frequency band. The resonant structure, combined with a high resolution readout device and a frequency-compensating numerical processor, can amplify magnetic fluctuations in a broad range of frequencies. A solenoid coil surrounding the resonant structure may be used to null the quasi-static earth's magnetic field and thereby increase the dynamic range of the sensor. Cryogenically cooling the resonant structure can improve the resolution of the sensor. A magnetometer that embodies features of the present invention is miniaturized and has improved amplification and resolution at room temperature.

27 Claims, 12 Drawing Sheets

(51) Int. Cl.
G01R 33/035 (2006.01)
G01R 33/00 (2006.01)

(58) Field of Classification Search
CPC ..... G01R 33/028; G01P 15/132; G01P 15/08;
G01P 15/105; G01P 2015/0828; G01P
2015/0814; G01P 2015/0831; G01C
19/5719
See application file for complete search history.

(56) References Cited

U.S. PATENT DOCUMENTS

| | | | |
|---|---|---|---|
| 5,022,765 A * | 6/1991 | Guidotti | G01J 1/24 356/370 |
| 5,908,986 A | 6/1999 | Mitamura | |
| 5,945,898 A | 8/1999 | Judy et al. | |
| 6,250,156 B1 | 6/2001 | Seshia et al. | |
| 6,429,652 B1 * | 8/2002 | Allen | G01C 17/28 324/259 |
| 6,487,864 B1 | 12/2002 | Platt et al. | |
| 6,670,809 B1 | 12/2003 | Edelstein et al. | |
| 7,231,094 B2 | 6/2007 | Bickford et al. | |
| 7,394,245 B2 | 7/2008 | Brunson et al. | |
| 7,642,692 B1 | 1/2010 | Pulskamp | |
| 7,696,749 B2 * | 4/2010 | Sunier | G01R 33/028 324/244 |
| 7,773,228 B1 | 8/2010 | Hollingsworth et al. | |
| 7,972,888 B1 | 7/2011 | Li et al. | |
| 8,674,689 B1 * | 3/2014 | Nielson | G01R 33/0286 324/244.1 |
| 9,182,454 B1 | 11/2015 | Williams et al. | |
| 2002/0162947 A1 * | 11/2002 | Weitekamp | B82Y 15/00 250/214 R |
| 2003/0200807 A1 | 10/2003 | Hulsing | |
| 2005/0253055 A1 * | 11/2005 | Sprague | G02B 26/085 250/234 |
| 2006/0032306 A1 | 2/2006 | Robert | |
| 2007/0096729 A1 | 5/2007 | Brunson et al. | |
| 2007/0236213 A1 * | 10/2007 | Paden | A61B 3/16 324/228 |
| 2010/0045274 A1 * | 2/2010 | Loehndorf | G01R 33/09 324/207.21 |
| 2011/0304325 A1 * | 12/2011 | Walther | G01R 33/022 324/209 |
| 2014/0182377 A1 | 7/2014 | Lin et al. | |
| 2014/0308757 A1 | 10/2014 | Ju | |
| 2015/0126829 A1 * | 5/2015 | Bernstein | A61B 5/6868 600/309 |
| 2016/0081577 A1 | 3/2016 | Sridhar et al. | |
| 2016/0238631 A1 * | 8/2016 | Aharoni | G01Q 20/02 |
| 2017/0097382 A1 | 4/2017 | Bickford et al. | |
| 2017/0097394 A1 | 4/2017 | Bickford et al. | |

FOREIGN PATENT DOCUMENTS

| | | |
|---|---|---|
| EP | 2199741 A2 | 6/2010 |
| WO | 2012071545 A1 | 5/2012 |
| WO | 2014025353 A1 | 2/2014 |
| WO | 2014205356 A2 | 12/2014 |

OTHER PUBLICATIONS

Dilella, D., L.J. Whitman, R.J. Colton, T.W. Kenny, W.J. Kaiser, E.C. Vote, J.A. Podosek, L.M. Miller, "A Micromachined Magnetic-Field Sensor Based on an Electron Tunneling Displacement Transducer," Sensors and Actuators. vol. 86, pp. 8-20, 2000.
Dong, S., J. Zhai, F. Bai, J.-F. Li, D. Viehland, "Push-Pull Mode Magnetostrictive/Piezoelectric Laminate Composite with an Enhanced Magnetoelectric Voltage Coefficient," Applied Physics Letters, vol. 87, pp. 62502. 2005.
Gabrielson, T.B., "Mechanical-Thermal Noise in Micromachined Acoustic and Vibration Sensors," IEEE Transactions on Electron Devices, vol. 40, No. 5, pp. 903-909, 1993.
Kyynarainen, J., J. Saarilahti, H. Katielus, A. Karkkainen, T. Meinander, A. Oja, P. Pekko, H. Seppa, M. Suhonen, H. Kuisma, S. Ruotsalainen, M. Tilli, "A 3D Micromechanical Compass," Sensors and Actuators A, vol. 142, pp. 561-568. 2008.
Latorre, L., V. Beroulle, Y. Bertrand, P. Nouet, and I. Salesse, "Micromachined CMOS Magnetic Field Sensor with Ferromagnetic Actuation," Proceedings of SPIE, vol. 4019, 2000.
Tatarchuk, J. J., C. B. Stevens, and R. N. Dean, "A MEMS DC Current Sensor Utilizing Neodymium Rare Earth Magnets," Additional Conferences (Device Packaging, HiTEC, HiTEN, & CICMT): Jan. 2014, vol. 2014, No. DPC, pp. 001046-001071.
Vasquez, D., and J. Judy, "Optically-Interrogated Zero-Power MEMS Magnetometer," Journal of Microelectromechanical Systems, vol. 16, No. 2, pp. 336-343. 2007.
Wickenden, W., J.L. Champion, R.B. Givens, T.J. Kistenmacher, J.L. Lamb, and R. Osiander, "Polysilicon Xylophone Bar Magnetometers," SPIE vol. 3876, pp. 267-273. Sep. 1999.
Yang, H.H., N.V. Myung, J. Yee, D.-Y. Park, B.-Y. Yoo, M. Schwartz, K. Nobe, and J.W. Judy, "Ferromagnetic Micromechanical Magnetometer," Sensors and Actuators A, vol. 97-98, pp. 88-97, 2002.
Zhao, P., Z. Zhao, D. Hunter, R. Suchoski, C. Gao, S. Mathews, M. Wuttig, I. Takeuchi , "Fabrication and Characterization of All-Thin-Film Magnetoelectric Sensors," Applied Physics Letters, vol. 94, p. 243507. 2009.
Mlliams et al., "Vacuum Steered-Electron Electric-Field Sensor", Journal of Microelectromechanical Systems, pp. 1-10, Jan. 15, 2013.
Ando et al., "E-Field Ferroelectric Sensor: Modeling and Simulation", IEEE Instrumentation & Measurement Magazine, pp. 31-37, 2009.
Bogue, R., "Plessey launches range of unique electric field sensors", Sensor Review, vol. 32, No. 3, pp. 194-198, 2012.
Chen et al., "Micromachined ac/dc electric field sensor with modulated sensitivity", Sensors and Actuators, No. 245, pp. 76-84, Apr. 26, 2016.
Huang et al., "A novel high-sensitivity electrostatic biased electric field sensor", Journal of Micromechanics and Microengineering, vol. 25, pp. 1-9, Aug. 17, 2015.
Miles et al., "Report on Non-Contact DC Electric Field Sensors", Jun. 23, 2009.
Datskos et al., "Using Micro-Electra-Mechanical Systems (MEMS) as Small Antennas", IEEE, 2012.
Toney et al., "Detection of Energized Structures with an Electra-Optic Electric Field Sensor", IEEE, pp. 1364-1369, May 2014.
Detrov et al., "Electric Field Encephalography as a Tool for Functional Brain Research: A Modeling Study", PLOS ONE, vol. 8, No. 7, Jul. 3, 2013.
Angelakis et al., "EEG Neurofeedback: A Brief Overview and an Example of Peak Alpha Frequency Training for cognitive Enhancement in the Elderly", The Clinical Neuropsychologist, vol. 21, pp. 110-129, Feb. 16, 2007.
Ashrafulla, S., "EEG and MEG: functional brain imaging with high temporal resolution", Jun. 2013, <URL: https://ngp.usc.edu/files/2013/06/Syed_EEG_MEG.pdf>.
Basar et al., "A review of brain oscillations in cognitive disorders and the role of neurotransmitters", Brain Research, vol. 1235, pp. 172-193, Jul. 2, 2008.
Choi, K., "Electroencephalography (EEG) based neurofeedback training for brain-computer interface (BCI)", pp. 1-26, Sep. 2013.
Grummett et al., "Measurement of neural signals from inexpensive, wireless and dry EEG systems", Physiological Measurement, vol. 36, pp. 1469-1484, 2015.
Heintzelman et al., "Characterization and Analysis of Electric-field Sensors", IEEE, Dec. 17, 2015.
Kingsley et al., "Photrodes for physiological sensing", SPIE 5317, Optical Fibers and Sensors for Medical Applications IV, Jun. 2004.
Niv, S., "Clinical efficacy and potential mechanisms of neurofeedback", Personality and Individual Differences, vol. 54, pp. 676-686, Jan. 24, 2013.

(56) References Cited

OTHER PUBLICATIONS

Othmer, S., "Neuromodulation technologies: An attempt at classification", Introduction to Quantitative EEG and Neurofeedback: Advanced Theory and Applications, second edition, pp. 1-27, 2009.

Prance, H., "Sensor Developments for Electrophysiological Monitoring in Healthcare", Applied Biomedical Engineering, pp. 265-286, Aug. 2011.

Schalk et al., "Brain Sensors and Signals", A Practical Guide to Brain-Computer Interfacing with General-Purpose Software for Brain-Computer Interface Research, Data Acquisition, Stimulus Presentation, and Brain Monitoring, pp. 3-35, 2010.

Stikic et al., "Modeling temporal sequences of cognitive state changes based on a combination of EEG-engagement, EEG-workload, and heart rate metrics", Frontiers in Neuroscience, vol. 8, article 342, pp. 1-14, Nov. 2014.

Denison et al., "A Self-Resonant MEMs-Based Electrometer", IEEE Instrumentation and Measurement Technology conference Proceedings, May 2007, pp. 1-5.

Nawrodt et al., "High Mechanical Q-factor Measurements on Silicon Bulk Samples", Journal of Physics: Conference Series, vol. 122, 2008.

Teller, E., "Electromagnetism and Gravitation", Proc. Natl. Acad. Sci. USA, vol. 74, No. 7, pp. 2664-2666, Jul. 1977.

\* cited by examiner

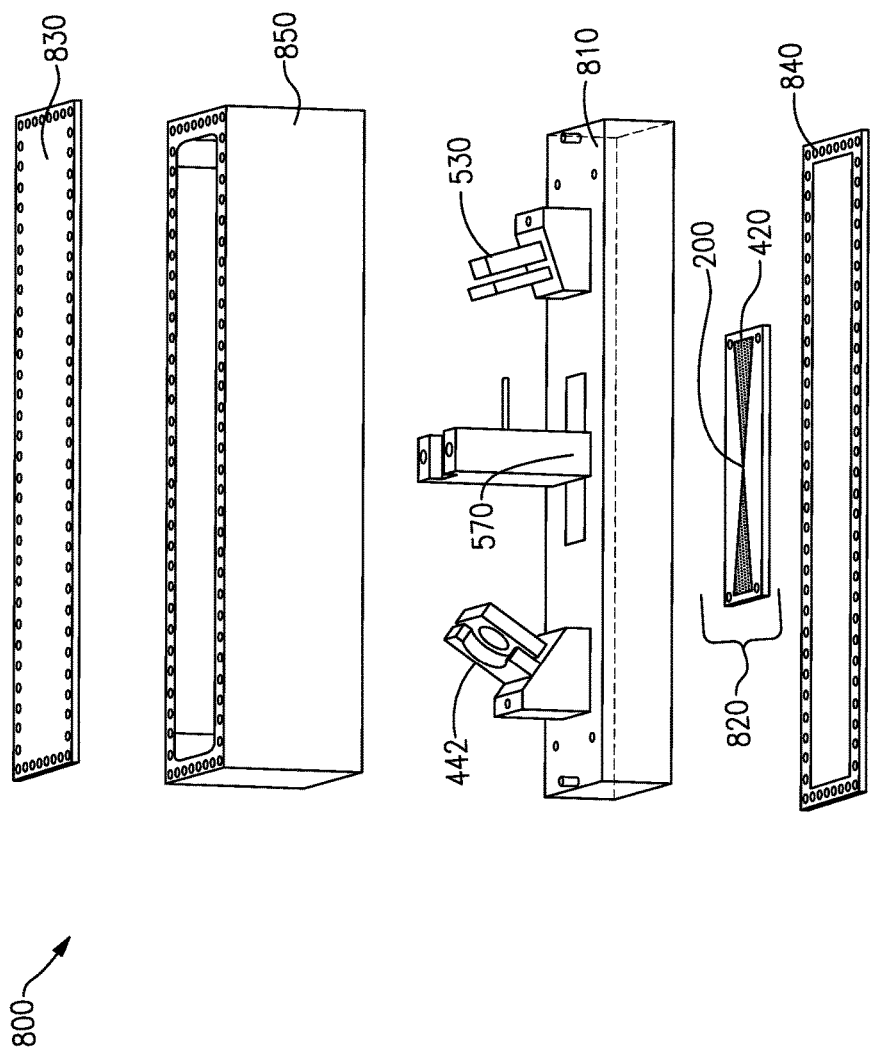

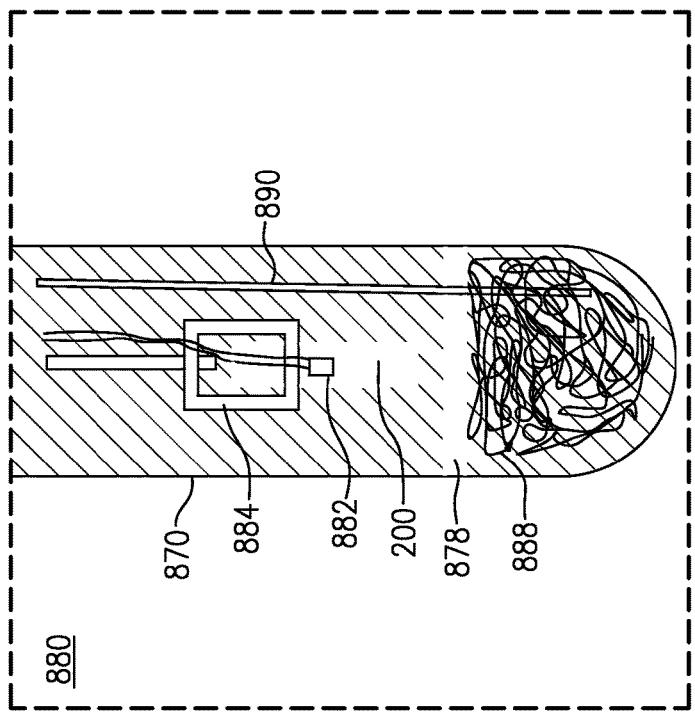
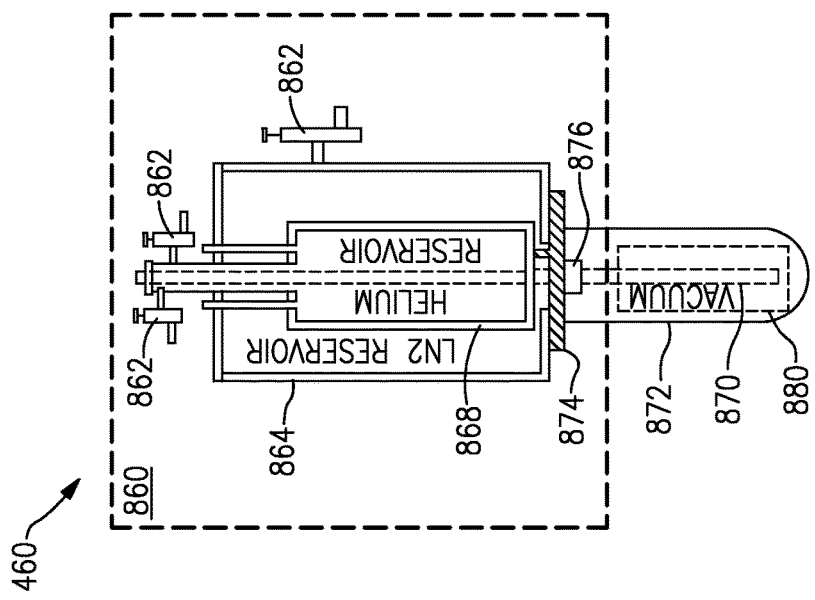
FIG.10B
FIG.10A

ULTRA-LOW NOISE SENSOR FOR MAGNETIC FIELDS

STATEMENT REGARDING FEDERALLY SPONSORED RESEARCH OR DEVELOPMENT

This invention was made with government support under Contract No. 12-C-8463 awarded by the U.S. Air Force. The government has certain rights in the invention.

CROSS REFERENCES TO RELATED APPLICATIONS

Not applicable.

BACKGROUND

The present disclosure relates to the measurement of extremely weak magnetic signals.

To detect and monitor military equipment, for example communications terminals and land, air, sea, and space vehicles, at great distances, it is desirable to observe unintended signals that are created by the equipment and propagate away. Electromagnetic waves are among the signals that are useful for this purpose. To avoid detection, an item of military equipment may be designed with great care to minimize the likelihood that its unintended electromagnetic emissions will reveal its presence to adversaries.

In spite of the care taken to reduce such emissions, any equipment that is electrically operated or that incorporates moving structures containing electrically conductive, magnetized, or magnetically permeable materials will unavoidably create static or quasi-static magnetic fields and time-varying electromagnetic fields during operation. These fields may be faint even in the immediate vicinity of the equipment and in any event will attenuate with distance from the equipment. Nevertheless, weak electromagnetic signals caused by the equipment will exist at great distances. In principle, the magnetic component of these signals may be exploited using an extremely sensitive magnetometer to detect even equipment that has been painstakingly designed to minimize the unintended fields it produces.

The performance of a magnetometer system is limited by the total noise that contributes to its measurement. The sensor itself, and its natural and human environment, all contribute to the total noise, which determines the system resolution, in Tesla/$\sqrt{Hz}$. A magnetometer must have a resolution on the order of 10 fT/$\sqrt{Hz}$ or better to detect magnetic signals from stealthy military systems at distances that permit effective surveillance or defense. Stated another way, the magnetometer must have input-referred noise on the order of 10 fT/$\sqrt{Hz}$ or less to be useful in important military applications. The output of an ultra-low noise sensor can be numerically processed to observe a weak magnetic signal of interest it contains. The same result cannot be achieved using a conventional sensor, because the signal of interest would still be indistinguishable from noise after the output of the conventional sensor has been processed.

In addition to ultra-low noise or, equivalently, high resolution, a magnetometer system that is useful for locating and monitoring stealthy military systems requires portability for field use and the ability to operate without cryogenic cooling and in the presence of the relatively large magnetic field of the earth. Conventional magnetometers lack this combination of attributes. In particular, a sensor would need to occupy less than 100 cm$^3$ to be sufficiently portable, while achieving the necessary resolution of 10 fT/$\sqrt{Hz}$. State of the art magnetometers using superconducting quantum interference device (SQUID) sensors can achieve the necessary resolution, but occupy more than 30,000 cm$^3$ and require cryogenic cooling. Certain atomic magnetometers, for example spin-exchange relaxation-free (SERF) magnetometers, may be suitable for miniaturization but are saturated by the earth's magnetic field and therefore unable to measure weak magnetic fields and fluctuations in its presence.

For the foregoing reasons, there is a need for ultra-low noise magnetometers that are compact, unaffected by the earth's magnetic field and preferably able to operate without cryogenic cooling.

SUMMARY

The present invention is directed to a magnetometer that satisfies this need. A magnetometer embodying features of the present invention comprises a mechanically resonant structure with a high quality factor. The resonant structure comprises a proof mass that is magnetized, and a mechanism that suspends the proof mass and exerts a restoring force on it. The resonant structure oscillates naturally at its resonance frequency.

In one aspect, the magnetometer may be configured to resonantly amplify an external magnetic field in a band of frequencies around the mechanical resonance frequency of the resonant structure. In some examples, the magnetometer may further comprise an optional magnetic flux modulator configured to amplify magnetic fields in a fixed or tunable frequency band that may not be around the mechanical resonance frequency.

In another aspect, the magnetometer may optionally further comprise a high resolution readout device and a frequency-compensating numerical processor to amplify magnetic fields in a broad range of frequencies. In some examples, the magnetometer may further comprise optional pieces of magnetically permeable material located near the proof mass and configured to concentrate magnetic flux at the location of the proof mass. In this manner, the amplification of the magnetometer may be increased.

In some examples, the magnetometer may further comprise an optional electromagnet that is located so as to produce a magnetic field at the location of the proof mass. The electromagnet is configured as part of a feedback loop. In a further aspect, feedback loop includes a low pass filter, so that the loop nulls the quasi-static magnetic field of the earth at the location of the proof mass. In this manner, the dynamic range of the magnetometer may be increased. In another aspect, the electromagnet may be a solenoid coil that surrounds the proof mass and produces a uniform magnetic field at its location.

In some examples, the magnetometer may further comprise an optional cryogenic cooling system, configured to cool the resonant structure without adding noise to the magnetometer measurement. In this manner, the resolution of the magnetometer may be improved.

In another aspect, a method embodying features of the present invention comprises providing a resonant structure having high quality factor and a resonance frequency. At least one magnet is attached to the proof mass of the resonant structure. The displacement of the proof mass in response to a magnetic field is amplified by the mechanical resonance of the resonant structure. The displacement of the proof mass is measured and used to compute the magnitude of a component of the magnetic field at the resonance frequency. In some examples, the method further comprises providing a flux modulator and using it to modulate the magnetic flux at the location of the proof mass. The modulating waveform may be chosen so that, after modulation, a frequency component of interest in the magnetic field excites the proof mass at the resonance frequency.

In another aspect, a method embodying features of the present invention comprises providing a resonant structure having high quality factor and a resonance frequency. At least one magnet is attached to the proof mass. A high resolution readout system produces an electrical output as a function of the displacement of the proof mass. The output of the readout system is processed using a transfer function that accounts for the frequency response of the resonant structure, providing a frequency-compensated output. The frequency-compensated output is used to compute the magnetic field over a range of frequencies.

In another aspect, a magnetometer embodying features of the present invention comprises a mechanically resonant structure having a magnetized proof mass. A high resolution readout system measures the displacement of the proof mass. A processor processes the output of the readout system with a frequency-compensating transfer function.

These and other aspects and features and various combinations of them may be expressed as methods, apparatus, systems, means for performing functions, program products, and in other ways. Other features and advantages will be apparent from the description and the appended claims.

BRIEF DESCRIPTION OF THE DRAWINGS

The invention and the following detailed description of certain embodiments thereof may be better understood by reference to the following figures:

FIG. 9 illustrates a specific embodiment of the magnetometer of FIG. 4 incorporating the high resolution optical readout system of FIG. 5A.

FIG. 10A is a diagram of a specific embodiment of an optional cryogenic cooling system for use with the magnetometer of FIG. 4.

FIG. 10B is an expanded diagram of a specific embodiment of the lower end of the sample tube of the cryogenic cooling system of FIG. 10A.

DETAILED DESCRIPTION

In the Summary above, the Detailed Description and the claims below, and in the accompanying drawings, reference is made to particular features and method steps of the invention. It is to be understood that the disclosure of the invention in this specification includes all possible combinations of those features.

References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Thus the term "or" should generally be understood to mean "and/or," and so forth.

References to "resolution" herein should be understood to mean the square root of the average input-referred noise power of the magnetometer system, per root hertz of bandwidth, in Tesla/$\sqrt{Hz}$, in a frequency band of interest. The total input-referred noise power comprises contributions from noise sources both internal to the magnetometer system and in the natural and human environment.

References to "scale factor" herein should be understood to mean the gain or amplification of a magnetometer, which may be calculated as the amplitude of the voltage or current output, or the change in torsion bar or proof mass angle, divided by the amplitude of the corresponding magnetic flux density input (in Volts/Tesla, Amperes/Tesla, or Radians/Tesla, respectively).

References to "quality factor," "Q factor" or "Q" herein, used with reference to a mechanical resonator, should be understood to mean the ratio of the total energy stored in the resonator to the amount of energy dissipated by the resonator in one cycle of its resonant motion.

The term "major surface" herein, used with reference to a rectangular cuboid, or similar three dimensional shape, having two dimensions longer than a third dimension, means a face of the cuboid that extends in the two longer dimensions.

The term "minor surface" herein, used with reference to a rectangular cuboid, or similar three dimensional shape, having two dimensions longer than the third dimension, means a face of the cuboid other than a major surface.

The term "major axis" herein, used with reference to a rectangular cuboid, or similar three dimensional shape, having one dimension longer than the other two dimensions, means an axis through the centroid of the cuboid and parallel to an edge of the cuboid that extends in the long dimension.

Figure 1:
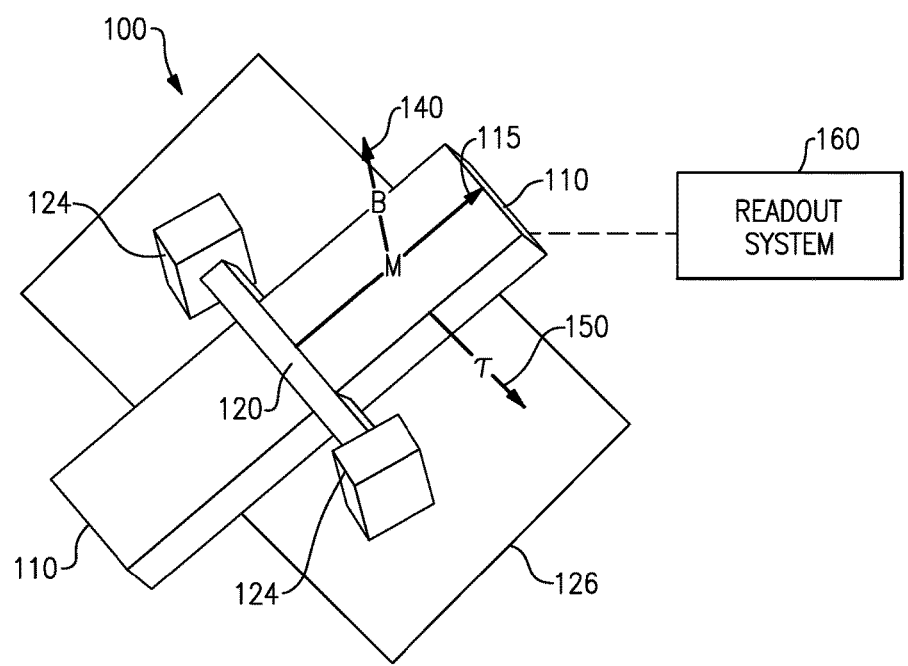
FIG. 1 is a schematic representation of an exemplary torsion bar magnetometer sensor.

Referring to FIG. 1, an exemplary microfabricated magnetometer sensor may be a MEMS torsion bar magnetometer 100, comprising a permanent magnet 110 attached to a torsion bar 120. Both ends of the torsion bar 120 are attached to anchors 124, and the anchors 124, in turn, are attached to a substrate 126. The anchors 124 immobilize the ends of the torsion bar 120, and the torsion bar 120 constrains the permanent magnet 110 to move by rotating about an axis connecting the anchors 124.

In the absence of any external forces, the magnet 110 rests in a force-free equilibrium position in which the torsion bar 120 is untwisted. An external force on the magnet 110 creates a torque about the axis. A torque that rotates the magnet 110 out of its force-free equilibrium position twists the torsion bar 120 and causes it to exert a restoring torque on the magnet 110. In the presence of a steady external force, the magnet 110 rests in a position in which the external torque is balanced by restoring torque of the torsion bar 120. The displacement of the magnet 110 from its force-free equilibrium may be measured and used to calculate the magnitude of the force.

An external magnetic flux density 140 penetrates the sensor 100. The total external magnetic flux density 140 is a superposition of fields created by human activity and fields created naturally by, for example, the earth's magnetic dipole and atmospheric lightning. Among the human-created fields are signals of interest, which may be the signatures of military equipment.

The magnetization 115 of the permanent magnet 110 is directed normal to the torsion bar 120, along the major axis of the magnet 110. The magnetic flux density 140 causes a magnetic torque 150 on the magnet 110, in proportion to the component of the magnetic flux density 140 directed normal to the magnetization 115 of the magnet 110. By measuring the displacement of the magnet 110 from its force-free equilibrium, the readout system 160 senses the projection of the magnetic flux density 140 in the direction normal to the plane containing the torsion bar 120 and the magnetization 115. For small displacements, the magnetometer 100 senses the field component approximately normal to a major surface of the magnet 110 in its force-free equilibrium position. The readout system 160 may incorporate a capacitive pickup, optical pickup, a tunneling tip, or another transducer modality to transform the displacement of the magnet 110 into a digital or analog electrical signal. In this manner, the magnetometer sensor 100 transforms an external magnetic flux density 140 into a measurable signal.

An example of a conventional MEMS torsion bar magnetometer 100 may use an electron tunneling displacement transducer to measure the displacement of the magnet 110 as part of a readout system 160. A miniaturized magnetometer system with such a tunneling tip readout, operated without high Q mechanical resonant amplification, has demonstrated resolution of 0.3 nT/$\sqrt{Hz}$. See Dilella, D., L. J. Whitman, R. J. Colton, T. W. Kenny, W. J. Kaiser, E. C. Vote, J. A. Podosek, L. M. Miller. "A micromachined magnetic-field sensor based on an electron tunneling displacement transducer," Sensors and Actuators. Vol 86, 2000. Resolution of 10 fT/$\sqrt{Hz}$, or better, is needed to detect the signatures of military equipment at ranges exceeding 1 km. Thus, the resolution of this representative, miniaturized, non-resonant magnetometer sensor must be improved by at least four orders of magnitude to detect distant military equipment.

Figure 2:
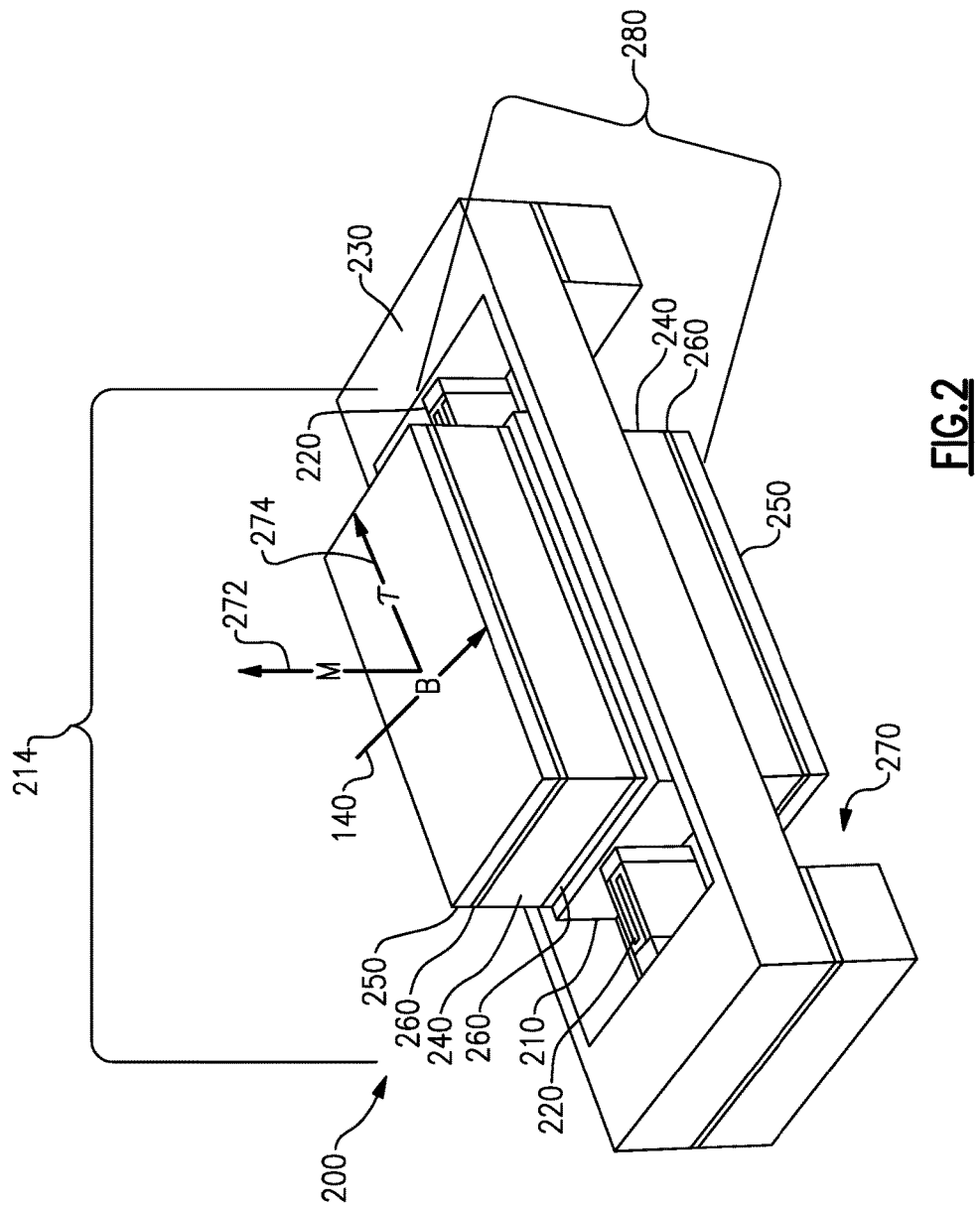
FIG. 2 illustrates an embodiment of an out-of-plane magnetometer sensor incorporating a resonant microstructure according to the present invention.

Referring to FIG. 2, a first embodiment of a magnetometer sensor 200 embodying features that enable 10 fT/$\sqrt{Hz}$ resolution comprises two magnets 240 affixed to a body 210, and forming part of a resonant microstructure 214. For example, one major surface of each magnet 240 may be adhered by a flexible adhesive to a major surface of the body 210 to form the proof mass 280 of the resonant microstructure 214. Preferably, the resonant microstructure 214 has a high quality factor, Q. The exemplary resonant microstructure 214 comprises a proof mass 280, incorporating magnets 240, connected by flexures 220 to a semiconductor support structure 230. The semiconductor support structure 230, in turn, is mechanically attached to a substrate 270. In embodiments, the substrate 270 may be a planar semiconductor wafer. The body 210 and flexures 220 may be micromachined from a semiconductor wafer using MEMS fabrication techniques. Optionally, a planar mirror 250 may be permanently attached to a second major surface of each of the magnets 240, in which case the mirrors become part of the proof mass 280. Exemplary dimensions of a magnetometer sensor 200 are 2 mm along the axis of attachment to the substrate 270 and 1.5 mm in both directions normal to the axis.

FIG. 2 illustrates an exemplary magnetometer sensor 200 that incorporates a resonant microstructure 214, which may be conveniently manufactured by techniques well known in the art of microfabrication. It will be appreciated that the exemplary resonant microstructure 214 is representative of miniaturized resonant structures generally and that features of the present invention may be embodied in a variety of resonant structures 214 that are not micro fabricated. As a result, the present disclosure refers interchangeably to resonant microstructures 214 and resonant structures 214.

In embodiments, the magnets 240 are attached to the semiconductor body 210 by an adhesive. Suitable adhesives include, but are not limited to, soft adhesives such as PDMS or silicone rubber. The adhesive is disposed in two adhesive layers 260, each preferably about 25 μm thick, each between a major surface of one of the magnets 240 and a major surface of the body 210. Similarly, each optional planar mirror 250 may be attached to a magnet 240 by a layer 260 of the same or another suitable adhesive. It will be appreciated that other embodiments may omit any separate planar mirror 250 and instead employ the polished surface of the magnet 240, or an optically reflective coating deposited on a surface of the magnet 240, to serve the function of a mirror 250. The optically reflective coating may be formed as a thin film of a metal, such as aluminum, or a stack of dielectric films having alternating high and low values of refractive index and thicknesses necessary to form a reflective structure at the designed angle of incidence. It will further be appreciated that the proof mass 280 may comprise a single piece of magnetized material, in place of a composite structure made of a body 210 and discrete magnets 240.

In embodiments, each magnet 240 may consist of a rare Earth permanent magnet, for example NdFeB or $Sm_2Co_{17}$, a ferrite, or an alloy of aluminum, nickel and cobalt, such as a casting of Alnico 6. A ferrite magnet has low electrical conductivity, which reduces sensor noise by minimizing eddy current losses in the magnet 240. Advantageously, Alnico has high relative permeability and low magnetization sensitivity to temperature due to its high Curie point temperature, which improves the scale factor stability of a magnetometer sensor 200 incorporating an Alnico magnet.

In other embodiments, the magnet 240 may consist of a high critical temperature ("high $T_C$") superconducting material, for example YBCO, in which a magnetization field 272 is created at room temperature and then preserved, or "frozen in," by cryogenic cooling. When the material is cooled to cryogenic temperatures while an applied magnetic field is in place, it retains its magnetization 272 after the applied field is removed and so forms a permanent magnet 240 until it is again warmed above cryogenic temperatures. A superconducting permanent magnet 240 formed by cooling thin films of high temperature superconductor can achieve a magnetic moment per unit volume significantly greater than a rare earth permanent magnet. In this manner, the polar moment of inertia of the proof mass 280 may be reduced for a given magnetic moment, thereby reducing the sensor noise that results from Brownian motion of the proof mass 280, as further described with reference to Eq. 1 below.

An external magnetic flux density 140 exerts a torque 274 on the permanent magnets 240, which causes the proof mass 280 to rotate in the manner of a magnetic compass, tending to align the magnetization direction 272 of the magnets 240 with the direction of the magnetic flux density 140. The flexures 220 constrain the body 210 to move principally by rotating about the axis that connects them. Because in this embodiment the body 210 rotates out of its resting plane in response to an applied magnetic flux density 140, the magnetometer sensor 200 has a configuration known as "out-of-plane." Rotation of the proof mass 280 twists the flexures 220, which provide a restoring force that increases with the magnitude of the angular displacement. Similar to the torsion bar magnetometer described above with reference to FIG. 1, the magnets 240 are configured to rotate against a restoring force. The component of magnetic flux density 140 in the direction shown in FIG. 2 determines the equilibrium position of the proof mass 280. The equilibrium angular displacement of the proof mass 280 may be measured and used to obtain the magnitude of that component of the magnetic flux density 140.

An out-of-plane magnetometer sensor 200 is an example of a magnetic transducer. In general, a magnetic transducer converts the magnetic flux density 140 observed in a sensor volume into a signal, which may be an electrical, mechanical, optical, or other representation of the magnetic flux density 140. In the embodiment of the out-of-plane magnetometer sensor 200 illustrated in FIG. 2, the magnetic flux density 140 in a sensor volume coinciding with the proof mass 280 is converted into a mechanical representation, which is an angular displacement of the proof mass 280.

In the embodiment illustrated in FIG. 2, the magnetization 272 of the permanent magnet 240 is directed normal to the plane of the substrate 270, but it will appreciated that other orientations of the magnetization 272 may be used. For example, if the magnetization 272 is directed in the plane of the substrate and normal to the axis of rotation of the body 210, a magnetic flux density 140 directed normal to the substrate 270 produces a maximum torque 274 around the axis of rotation. In this manner, the sensor 200 can be made to detect the component of magnetic flux density 140 normal to the substrate, instead of the component illustrated in FIG. 2.

The proof mass 280 of the resonant microstructure 214 oscillates under the influence of its own inertia and the restoring force of the flexures 220. Preferably, the resonant microstructure 214 achieves the highest possible quality factor Q. Higher values of Q advantageously reduce the Brownian motion of the proof mass 280. Brownian motion of the proof mass 280 produces noise in the measurement of the magnetic flux density 140. As a result, reduced Brownian motion allows a lower noise floor and improved resolution of the magnetometer sensor 200. In addition, a resonant microstructure 214 amplifies periodic forces at its resonance frequency in proportion to its Q value. For this reason, operation of the resonant magnetometer sensor 200 at or near its resonance frequency, known as resonant operation, greatly enhances the gain, or scale factor, of the sensor 200.

Figure 3:
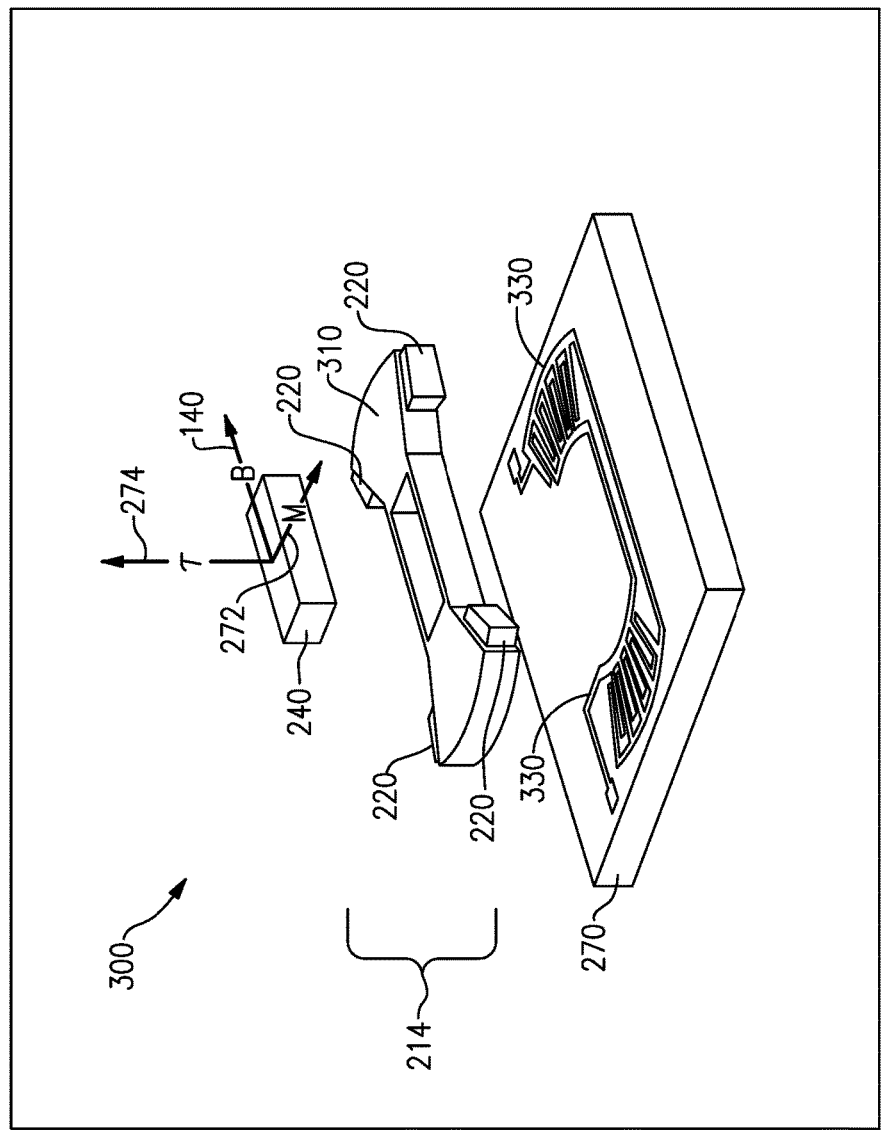
FIG. 3 illustrates an embodiment of an in-plane magnetometer sensor incorporating a resonant microstructure and a capacitive readout device.

Referring to FIG. 3, a second embodiment of a magnetometer sensor 300 embodying features for high resolution comprises a permanent magnet 240 affixed as part of a resonant microstructure 214. The exemplary resonant microstructure 214 comprises a body 310 connected by flexures 220 to a semiconductor substrate 270. The substrate 270 incorporates exemplary metallizations forming interdigitated electrode arrays 330. The body 310 may incorporate a micromachined cavity to receive and locate the permanent magnet 240. As in the embodiment shown in FIG. 2, the body 310 and permanent magnet 240 together form the proof mass 280 of the resonant microstructure 214. The magnet 240 may be designed for a press fit in the cavity, or it may be adhered to the cavity by a suitable adhesive, such as an adhesive described above with reference to FIG. 2. The fan shaped portions of the body 310 may be shaped to form radial teeth (not shown in FIG. 3) in the side of the body 310 facing the substrate 270, in a pattern that matches the electrode arrays 330.

The magnetometer sensor 300 illustrated in FIG. 3 is known as having an "in-plane" configuration because in this embodiment the resonant microstructure 214 rotates within its resting plane in response to an applied magnetic flux density 140. An in-plane magnetometer sensor 300 is an example of a magnetic transducer, which, in general, converts the magnetic flux density 140 observed in a sensor volume into a signal, which may be an electrical, mechanical, optical, or other representation of the magnetic flux density 140. In the embodiment of the in-plane magnetometer sensor 300 illustrated in FIG. 3, the magnetic flux density 140 in a sensor volume coinciding with the magnet 240 is converted into a mechanical representation, which is an angular displacement of the body 310.

Conductive traces may be fabricated on the semiconductor substrate 270 by means of photolithographic patterning, an additive process, such as inkjet or aerojet printing, or another technique. In embodiments, the conductive traces may form two interdigitated electrode arrays 330 used as part of a capacitive readout. In the absence of a magnetic field, the body 310 rests in a position in which it covers the arrays 330. A magnetic flux density 140 that causes the body 310 to rotate relative to the arrays 330 changes the capacitance between the array terminals. If a constant bias voltage is applied to the array terminals, the change in capacitance causes a displacement current to flow through the capacitor formed by the two arrays 330. Measuring the displacement current, using techniques well known in the art of electronics, provides an extremely sensitive indication of the rotation of the body 310 and the associated magnetic flux density 140. Such a capacitive readout is able to resolve linear displacements on the order of $10^{-14}$ m. Embodiments of the integrated capacitive readout device illustrated in FIG. 3 can be fabricated orders of magnitude smaller than an optical readout device and yet provide a scale factor equivalent to that of an optical readout.

Figure 4:
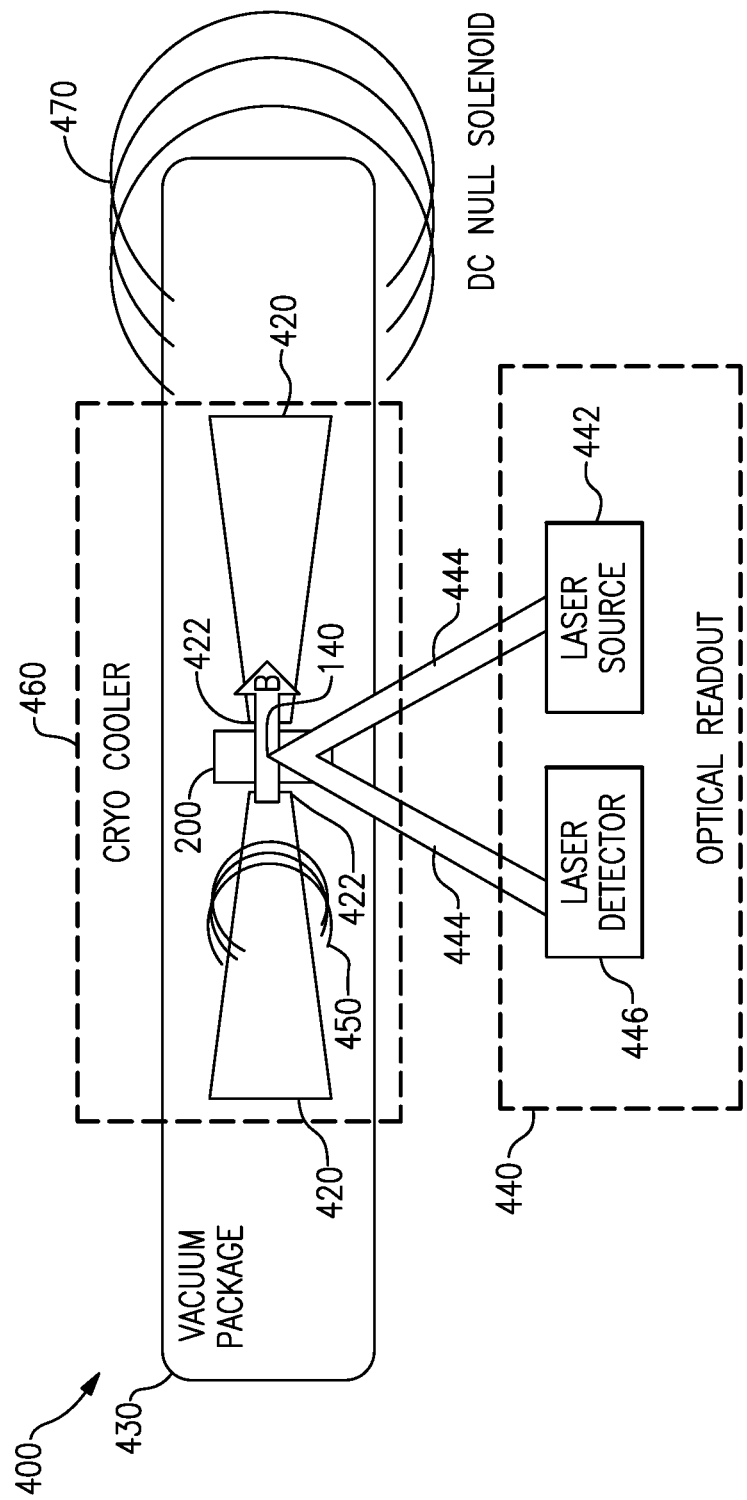
FIG. 4 illustrates an embodiment of a magnetometer system with an optional optical readout device and an optional DC null solenoid.

Referring to FIG. 4, an exemplary magnetometer system 400 embodying features for high resolution may optionally locate a magnetometer sensor 200 in the air gap between the poles 422 of a flux concentrator 420. While FIG. 4 illustrates an out-of-plane sensor 200, it will be appreciated that embodiments of an in-plane sensor 300 also may be integrated with a flux concentrator 420. The flux concentrator 420 comprises two or more pieces of highly permeable material, one or more of which may be combined with an optional wire coil 450 to form a flux modulator. The magnetometer sensor 200 and flux concentrator 420 may be sealed within a vacuum package 430 from which gas has been evacuated, preferably to reduce the pressure within the package to less than 1 mTorr. An optional optical readout device 440 may be located outside the vacuum package 430 within line of sight of the magnetometer sensor 200. In embodiments, the magnetometer system 400 may also incorporate one or more optional electromagnets capable of producing a magnetic field at the location of the sensor 200. The electromagnets are illustrated in FIG. 4 as DC null solenoids 470 that surround at least the magnetometer sensor 200 and may in addition surround the optical readout system 440 and the vacuum package 430.

An external magnetic flux density 140 surrounds and penetrates the magnetometer system 400. The concentrator 420 multiplies the flux density 140 present in the sensor 200, thereby creating within the sensor an amplified representation of the signals of interest along with other components of the external magnetic flux density 140. In examples, the factor by which the concentrator 420 increases the magnetic flux density, known as the concentrator gain, may be 50 or more.

The concentrator 420 may be shaped in the form of paired rods or wedges, or in other suitable forms, each rod or wedge having a pole 422 that faces the sensor magnet 240. Preferably, the poles 422 of the concentrator 420 are approximately one-half as wide as the corresponding faces of the magnet 240, but other pole dimensions may be suitable. The concentrator 420 is made of a highly permeable material, such as ferrite or mu metal. The shape and high permeability of the pieces of the concentrator 420 serve to multiply the magnetic flux density 140 between the poles 422, relative to the value of flux density 140 that would exist there in the absence of the concentrator 420. In embodiments, the concentrator 420 may comprise two layers of tapered ferrite material located close to the magnetometer sensor 200. In these or other embodiments, the concentrator 420 may comprise additional highly permeable pieces located at a greater distance from the sensor 200, and even outside of a vacuum package 430 that optionally contains the sensor 200.

Reducing the gap distance between the poles 422 of the concentrator 420 and the sensor magnet 240 increases the concentrator gain, but decreases the Q of the resonant sensor 200 due to eddy current losses that increase the damping of the resonant structure 214. Changing the gap distance may also be used to tune the resonance frequency of the resonant microstructure 214 by altering the restoring force on the proof mass 280. A suitable value of the gap distance is 50 μm, but other values may be used.

Optionally, the concentrator 420 may be adapted to modulate as well as concentrate the magnetic flux 140. If the concentrator 420 is combined with a wire coil 450, the assembly of the two parts may be operated as a flux modulator. By employing circuits and techniques well known in the art of electronics, an external circuit may be used to cause a current to flow in the coil 450. Increasing current flowing in the wire coil 450 causes increasing magnetic flux 140 within the concentrator material until a saturating current is reached, at which point the material is magnetically saturated. When the concentrator material is saturated, the magnetic flux 140 through the air gap of the concentrator 420 no longer responds to the external magnetic flux density 140. For example, the flux concentrator 420 may comprise paired high permeability rods arranged end-to-end, which concentrate the magnetic flux density 140 in the air gap between them. The wire coil 450 may be wrapped around an end of one of the rods so as to change the magnetic flux through the rod when current flows in the coil. In the presence of the saturating flux, the effective permeability of the rod end approaches that of air or vacuum, effectively increasing the air gap and decreasing the concentrator gain. A magnetometer sensor 200 placed in the air gap observes reduced magnetic flux density 140 when the coil 450 is excited with the saturating current.

By periodically varying the coil current, for example according to a sinusoidal or square waveform, the magnetic flux density 140 in the sensor 200 may be periodically modulated. The modulation frequency is twice that of the coil current waveform because saturation of the concentrator material occurs at both positive and negative extremes of current. It is preferable that the hysteresis loss per cycle and the saturation magnetic field level of the concentrator material be minimized to reduce the power necessary to drive it to saturation during the modulation cycle.

It will be appreciated that while a variable flux concentrator 420 is used to illustrate features of the present invention, other techniques may be used to modulate the magnetic flux density 140 in the sensor volume. In other embodiments, a flux diverter made of highly permeable material may surround the sensor volume and divert the flux 140 from the volume, unless the material is magnetically saturated. A wire coil may be used to increase the flux in the flux diverter and periodically saturate it, allowing the magnetic flux density 140 to periodically enter the sensor volume. In other embodiments, a shuttle made of highly permeable material may be configured to move cyclically and to thereby periodically switch the path of the flux 140 between a magnetic circuit that includes the sensor 200 and one that does not. In still other embodiments, the magnetometer sensor 200 may be moved in a manner that causes its magnetization 272 to rotate in a plane and thereby modulate the component of the magnetic flux 140 measured by the sensor 200.

Both the sensor 200 and the flux concentrator 420 may optionally be enclosed inside a vacuum package 430. In embodiments that comprise both a vacuum package 430 and an optical readout 440, the vacuum package 430 may be an evacuated, optically clear glass tube, for example a clear quartz or Pyrex tube, that is transparent to the laser light 444 used by the optical readout 440. It will be appreciated that a vacuum package 430 may used with not only an optical readout 440, but also with a capacitive readout or another readout technology. Advantageously, operating the magnetometer sensor 200 in a vacuum allows it to achieve very high Q, in examples greater than 100,000, by reducing the air damping of the proof mass motion.

Embodiments of the magnetometer system 400 may also incorporate an optional cryogenic cooling system 460 to cool the magnetometer sensor 200, and the proof mass 280 in particular, to temperatures near absolute zero. As discussed below with reference to Eq. 1, cooling the proof mass 280 advantageously decreases the input-referred Brownian noise of the sensor 200. Preferably, components of the cryogenic cooling system 460 located in the vicinity of the sensor 200 are made exclusively of nonmagnetic and dielectric or weakly conductive materials to reduce the noise introduced to the magnetometer 400 by eddy currents in the cooling system 460. An example of a suitable cryogenic cooling system 460 places no materials within 15 cm of the sensor 200, except the liquid nitrogen or helium cryogen itself, a quartz tube to contain the sensor 200 and the cryogen, a Delrin holder for the sensor 200, and a Pyrex vacuum package 430.

Referring to FIG. 2 and FIG. 4, the exemplary out-of-plane magnetometer sensor 200 may incorporate a planar mirror 250 that rotates as a unit with the sensor proof mass 280 in response to an external magnetic field 140. The mirror 250 may be used to reflect a laser beam 444 in connection with an optical readout device 440, comprising a laser source 442 and a laser detector 446, that measures the angular displacement of the proof mass 280. Movement of the mirror 250 changes the direction of the reflected laser beam 444 and the location of an associated spot of laser illumination, which may be sensed by the laser detector 446. In embodiments, the laser detector 446 may be a photodetector array, position sensing diode, split detector, interferometric device, or another optical sensor producing an electrical output that represents the angular displacement of the proof mass 280, and thereby also represents the magnitude of the external magnetic field 140. In alternate embodiments with differing optical path designs, the laser detector 446 may be located at a distance from the magnetometer sensor 200 as long as approximately one meter or as short as approximately 10 cm.

In embodiments, DC null solenoids 470 are used to cancel the quasi-static component of the earth's magnetic field, which typically is the largest single contributor to the magnetic flux density 140 measured by the sensor 200. Without the DC null solenoids 470, the earth's field would cause the proof mass 280 to rotate beyond the full scale measurement limit of the readout device 440, unless the scale factor of the magnetometer 400 were reduced, which would also undesirably reduce the gain for signals of interest. A magnetometer 400 capable of detecting signals of interest while also measuring the earth's field would require a dynamic range of greater than 180 dB, which is beyond the capability of otherwise useful optical readout systems 440. To reduce the dynamic range demanded of the optical readout 440, embodiments of the magnetometer system 400 may use one or more DC null solenoids 470 to cancel the quasi-static component of the earth's field. The scale factor may then be optimized for detecting signals of interest, without regard to the earth's field.

The null solenoids 470 are solenoid coils that, when supplied with an excitation current, produce a locally uniform magnetic field at the location of the sensor 200. In embodiments, the excitation current is the output of a signal conditioner, not shown, that may amplify and/or filter the output of the optical readout 440 or another readout device. In this manner, the null solenoids 470 provide the sensor 200 with magnetic feedback that is proportional to, or otherwise a function of, the magnetic flux density 140 measured by the sensor 200. Preferably, the magnetometer system includes three null solenoids 470, each having its axis orthogonal to those of the other two. Using techniques that are well known in the art of electronics, each null solenoid 470 may be separately excited by a current of amplitude such that the resultant magnetic field at the sensor 200 matches the magnitude of the earth's field, but is oppositely directed.

Because the earth's magnetic field varies with time, the excitation currents must vary accordingly. Using techniques that are well known in the art of electronics, the excitation of each null solenoid 470 may be determined by a negative feedback circuit that operates to reduce the output of the optical readout 440 at frequencies below a low frequency threshold. In this manner, the resultant magnetic field of the null solenoids 470 can be made to track variations in the earth's field up to the low frequency threshold. The threshold may be chosen below the characteristic frequency of any signal of interest, so that the sensor output produced by the earth's field is reduced relative to that produced by any signal of interest. It will be appreciated that the null solenoids 470 may be used to attenuate magnetic signals from any source at frequencies below the threshold frequency. In an exemplary magnetometer 400, the null solenoids 470 can, for example, attenuate low frequency noise from the cryogenic cooling system 460 and from external sources, such as atmospheric lightning, in addition to the earth's magnetic field.

Figure 5:
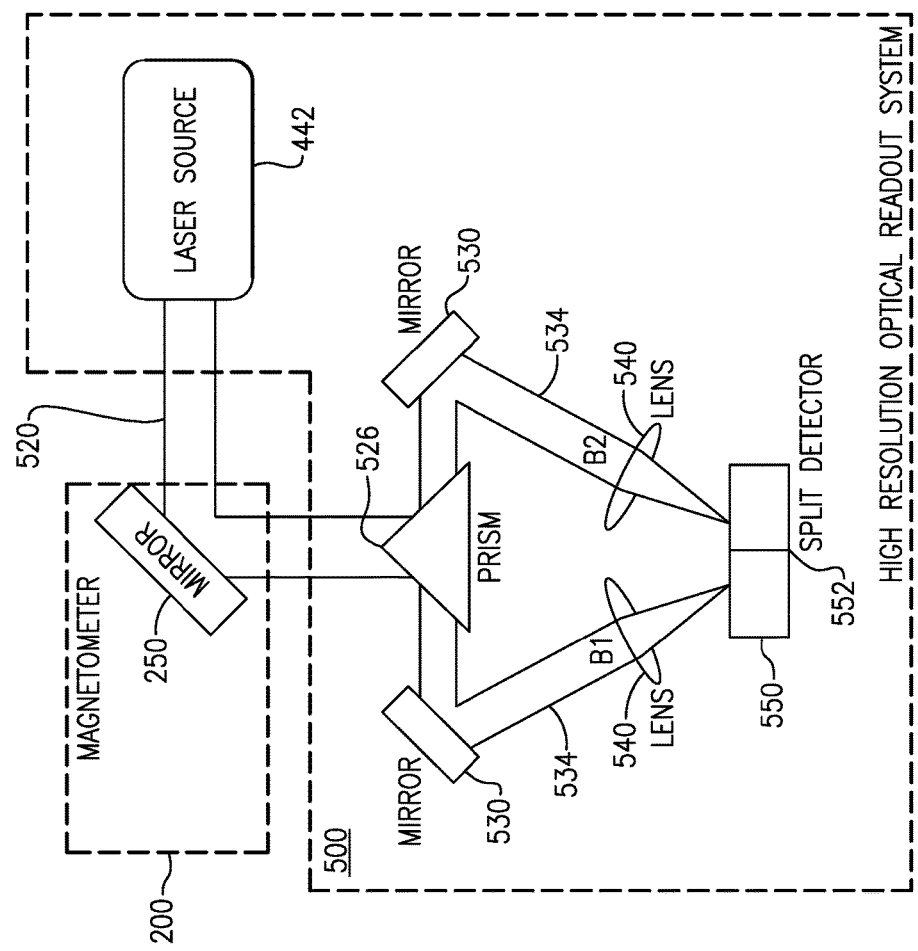
FIG. 5 illustrates an exemplary high resolution optical readout system that may be used with the magnetometer sensor of FIG. 2.

Referring to FIG. 5, an optical readout system may be embodied as a high resolution optical readout system 500. An exemplary high resolution optical readout system 500 comprises a laser source 442, a beam splitting prism 526, a mirror 530 and lens 540 in the path of each split beam 534, and a bilateral split detector 550. In examples, the split detector 550 may be a commercially available device, such as the New Focus Model 2901 manufactured by Newport Corporation. It will be appreciated that the components of the high resolution optical readout system 500 may be configured to accommodate any convenient optical path length, typically greater than 10 cm, between the magnetometer sensor 200 and the detector 550.

To measure the angular displacement of the magnetometer proof mass 280, the laser source 442 transmits a laser beam 520 toward the magnetometer mirror 250, which reflects it toward the beam splitting prism 526. The prism 526 creates two split beams 534, each directed toward a mirror 530 located on opposite sides of the prism 526. Each mirror 530 reflects one of the split beams 534 toward the split detector 550. A lens 540 in the path of each split beam 534 focuses the split beam 534 into a spot on a different half of the split detector 550. Preferably, the optical components are arranged so that, as the magnetometer mirror 250 rotates from one extreme to the other, the spot from neither split beam 534 enters the kerf 552 between the two halves of the bilateral split detector 550. In this manner, the outputs of the split detector 550 are advantageously made independent of the diameter of the laser beam 520 and the width of the kerf 552.

In embodiments, the prism 526, mirrors 530 and lenses 540 are located so that the paths of the split beams 534 are symmetric when the mirror 250 is in a force free equilibrium. In other embodiments, the optical components may be located so that the symmetric state exists when the mirror 250 is in equilibrium under the influence of a static external magnetic flux density 140. In the symmetric state, equal laser power travels in each split beam 534 and is focused on each half of the split detector 550. By operation of the photoelectric effect, each half of the split detector 550 produces an output current that is proportional to the laser power incident on it. In embodiments, the output optical readout system 500 may calculate the difference or ratio of the split detector outputs, which will be zero or unity, respectively, in the symmetric state. For example, a transimpedance amplifier may be used to translate the difference of the split detector output currents into a voltage signal suitable for transmission to data acquisition and processing equipment. It will be appreciated that the readout system 500 may compute other metrics from the split detector output, and the other metrics may also serve the purpose of quantifying the difference in laser power between the two split beams 534. It will further be appreciated that other light-sensitive devices, for example photodiodes, may be configured to produce electrical outputs dependent on the power in each of the two split beams 534, which outputs may be processed by the readout system 500).

In operation, as the proof mass 280 and the magnetometer mirror 250 rotate under the influence of an external magnetic flux density 140, the laser beam 520 shifts away from symmetric incidence on the prism 526 and, as a result, the difference in power between the split beams 534 increases with the rotation angle of the mirror 250. Correspondingly, the difference in the current output of the two halves of the split detector 550 also increases with rotation angle. The difference or ratio of the split detector outputs, or other metric computed from them, may thus be correlated with the rotation angle of the magnetometer mirror 250, from which the magnitude of the external magnetic flux density 140 may be computed. It will be appreciated that optical components other than the beam splitting prism 526, mirrors 530 and lenses 540, and other arrangements of these or other optical components may be used to achieve the intended result of separately focusing a variable fraction of the laser beam 520 on each half of a bilateral split detector 550, the fraction depending on the rotation of the mirror 250.

Figure 5A:
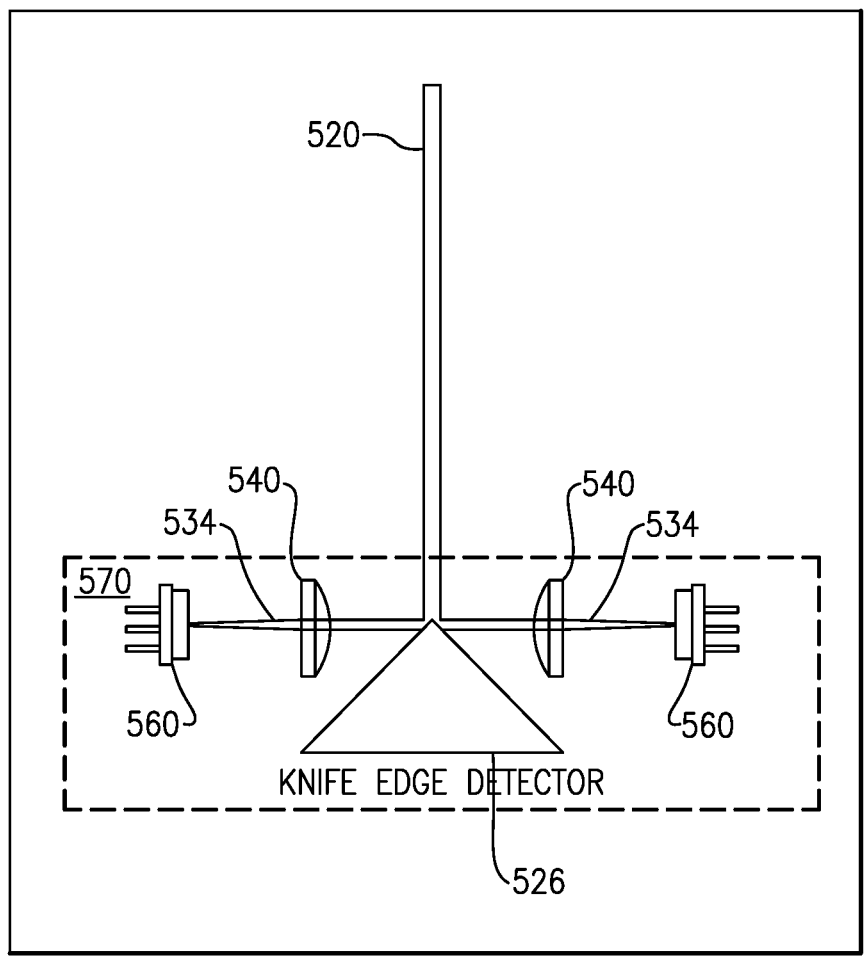
FIG. 5A illustrates an alternative embodiment of the high resolution optical readout system of FIG. 5.

Referring to FIGS. 5 and 5A, an alternate embodiment of a high resolution optical readout system 500 may incorporate a knife edge detector 570, comprising a pair of separately located photodiodes 560 in place of a split detector 550. In this embodiment, a rotation of the magnetometer mirror 250 sweeps the laser beam 520 across the knife edge of the prism 526, in the same manner as the previous embodiment, but the split beams 534 are each focused by a collection lens 540 onto a separate photodiode 560. Each photodiode 560 produces a current signal proportional to the intensity of the split beam 534 incident on it. The readout system 500 may process the resulting signals to quantify the difference in intensity of the split beams 534, as in the previous embodiment. The prism 526 may be a commercially available knife edge prism, for example a model MRAK25-P01, manufactured by Thorlabs Inc. It may be assembled with lenses 540 and photodiodes 560 to form a knife edge detector 570.

Embodiments of both in-plane and out-of-plane resonant magnetometer sensors 200 and 300 are preferably configured and operated in a manner that increases their scale factor, providing greater amplification, and that decreases their noise floor, providing improved resolution. External magnetic flux density 140 that fluctuates periodically at the resonance frequency causes an oscillation in the magnetometer proof mass 280 that is mechanically amplified in proportion to the Q value of the resonant microstructure 214. This mechanical amplification can greatly increase the scale factor of the magnetometer sensor 200 or 300 for magnetic field components in a narrow bandwidth around the resonant frequency. The transfer function of the magnetometer sensor 200 or 300 in resonant operation is proportional to Q in a bandwidth on the order of the resonant frequency divided by Q, a bandwidth which may be in the range of 1-10 mHz for Q values exceeding 200,000. Increasing the Q of the resonant microstructure 214 thus makes the magnetometer sensor 200 or 300 more sensitive to fluctuations of the magnetic field at the resonant frequency.

Increasing the Q of the resonant microstructure 214 also reduces the power spectral density of noise due to Brownian motion of the proof mass 280 and thereby improves the resolution of exemplary magnetometer systems 400 in which Brownian noise limits performance. The power spectral density of Brownian noise is given by:

$$N_B = \frac{1}{G_C} \sqrt{\frac{4k_B T_a \omega_0 I_0}{m_{mag}^2 Q}} \qquad \text{Eq. 1}$$

where $N_B$=input-referred Brownian noise (T/√Hz); $G_C$=concentrator gain; $k_B$=Boltzmann's constant (1.4×10$^{-23}$ J/K); $T_a$=proof mass temperature (K); $\omega_0$=resonance frequency (Hz); $I_0$=polar moment of inertia (kg-m$^2$) of the proof mass 280; $m_{mag}$=magnetic moment (A-m$^2$ or N-m/T); and Q=quality factor of the resonant microstructure 214. Increasing the value of Q or the concentrator gain, or decreasing the temperature of the proof mass 280, decreases the Brownian noise. The remaining parameters of Eq. 1, namely the resonance frequency, moment of inertia and the magnetic moment, are constrained by independent requirements on the sensor performance.

Because higher Q values provide the dual advantages of greater scale factor and reduced Brownian noise, embodiments of a resonant microstructure 214 preferably incorporate features that increase Q. For example, the Q value may be increased by using a vacuum package 430 to reduce air damping, and by reducing the hysteresis loss per cycle and eddy current loss of any flux concentrator material used with the sensor 200. In embodiments without a vacuum package 430, Q may be increased by decreasing the cross section of the semiconductor body 210 in its direction of motion. In the same or other embodiments, Q may be increased by reducing damping in the resonant microstructure 214 by, among other methods, using fewer, stiffer flexures 220. The flexures may be made stiffer by, in the example of an in-plane sensor 300, increasing their width in a direction normal to the plane in which the semiconductor body 210 moves. Referring to Eq. 1, the input-referred Brownian noise may also be reduced by means other than increasing Q, for example by using an optional cryogenic cooler 460 to decrease the temperature $T_a$ of the proof mass 280, or by using a flux concentrator 420 having higher gain $G_C$.

The resolution of an exemplary magnetometer system 400 is limited by a number of noise sources in addition to the Brownian motion of the proof mass 280, including the readout electronics, eddy currents generated in the system housing and any metal parts near the sensor 200 or 300, fields induced by the sensor electronics and wiring, acoustic input, seismic input, and the Barkhausen effect in the permanent magnets 240. In embodiments of a magnetometer sensor 200 or 300 that incorporate a capacitive readout, noise in the readout preamplifier causes an additional noise force on the proof mass 280, and eddy currents in the sense electrodes 330 add to the noise of the readout electronics. The root of the sum of the squares of the input-referred noise, in T/√Hz, from all of these sources set the noise floor of the system. With the exception of the Brownian noise, all of the noise sources can be reduced by careful design of the magnetometer sensor 200 or 300 and careful integration of the magnetometer system 400. Thus, the Brownian noise power Ns sets the ultimate limit on the resolution of the magnetometer system 400 when it is operated in its resonant mode.

A variety of design features may be employed to reduce the contribution of noise sources other than the Brownian motion of the proof mass 280. For example, a magnetometer sensor 200 or 300 with a capacitive pickup may incorporate optional design features that reduce electrode eddy current noise, which would dominate the noise sources if standard capacitive pickup plates were used, due to their close proximity to the proof mass 280. The power spectral density of eddy current noise can exceed 1000 fT/√Hz for standard metal electrodes. Referring to FIG. 3, the interdigitation of the exemplary capacitor electrodes 330 reduces their susceptibility to eddy currents. To further reduce eddy currents, the fan shaped portions of the body 310 may be micromachined to form radial teeth, not visible in FIG. 3, in the side of the body 310 facing the substrate 270. The relieved pattern of the teeth provides separation between the material of the body 310 and the metallization of the electrodes 330. Lower conductivity electrodes, for example those made of lightly doped silicon, may also be used to reduce eddy current noise. Interdigitation of the capacitor electrodes 330 has the added benefit of reducing the noise due to the preamplifier voltage force on the proof mass 280.

Eddy currents in the system housing can also constitute a significant noise source, but can be minimized by using nonmetallic parts. Acoustic noise input can be minimized or eliminated by using a vacuum package 430. Seismic input can be reduced by minimizing the distance between the center of gravity of the proof mass 280 and its center of suspension. Shock mounts between the sensor 200 or 300 and any instrument housing can further reduce seismic input by limiting the spectrum of vibration reaching the proof mass 280 to frequencies significantly below the resonance frequency.

A resonant magnetometer sensor 200 or 300, operating at high Q as described above, selects and greatly amplifies a single spatial component and single frequency component of the external magnetic flux density 140. The spatial component is directed normal to a plane containing the magnetization 272 and rotational axis of the proof mass 280. The frequency component is at the resonance frequency of the resonant microstructure 214. Because the external magnetic flux density 140 is generally a superposition of multiple components in arbitrary directions and at arbitrary frequencies, it is advantageous for a magnetometer system to measure all three spatial components and detect multiple frequency components.

In embodiments, three resonant magnetometer sensors 200 or 300 with identical resonance frequency may be closely collocated in a triad, with the sensitive direction of each sensor 200 or 300 orthogonal to the sensitive directions of the other two. In this manner, three orthogonal spatial components of the external magnetic flux density 140 may be simultaneously measured. A triad of sensors 200 or 300 may thereby provide the magnitude and direction of a single frequency component of the magnetic flux density 140. It will be appreciated that a dyad of two orthogonal sensors 200 or 300 may likewise be used to measure the projection of the magnetic flux density 140 in the plane of the two sensor directions.

Embodiments of a magnetometer system 400 may optionally be adapted to sensitively measure multiple frequency components or a range of frequency components of the external magnetic flux density 140. Three examples of such adaptations are described in the following paragraphs, in particular: a multi-frequency array, a flux modulator, and a broadband sensor comprising a high resolution readout coupled with frequency compensating electronics or signal processing. In embodiments incorporating a multi-frequency array, multiple sensors 200 or 300, each sensor 200 or 300 having a different resonance frequency, may be used to separately detect a magnetic field component at the resonance frequency of each sensor 200 or 300. In embodiments, the resonance frequencies may be uniformly spaced to create a frequency response that approximates a comb function. In other embodiments, the resonance frequencies used in the array may be chosen to optimally detect particular magnetic signatures of interest.

Referring to FIG. 4, an embodiment of a magnetometer system 400 that incorporates a flux modulator may also be used to detect magnetic field fluctuations at frequencies other than the resonant frequency. In such systems 400, the flux modulator operates as a frequency mixer. Modulation of the static component of the external flux density 140 produces a component of the modulated flux at the modulation frequency. In general, the external magnetic flux density 140 will be a superposition of components at various frequencies. Modulation of each frequency component will produce two modulated flux components, one at the sum of the modulation frequency and the external component frequency and another at the difference of those frequencies.

In embodiments, the modulation frequency may be chosen to equal the resonance frequency of the magnetometer sensor 200 to selectively amplify the static component of magnetic flux density 140. In other embodiments, the modulation frequency may be selected so that the difference of the modulation frequency and the frequency of an external signal of interest equals the resonance frequency. By so choosing the modulation frequency, the external component at the frequency of interest can be selectively amplified by the mechanical resonance of the sensor 200.

Finally, embodiments of a magnetometer system 400 operated in a broadband sensing mode may employ a high resolution readout 500 coupled with frequency compensation to measure a range of frequency components of the external magnetic flux density 140. Referring to FIG. 5, the exemplary high resolution optical readout 500, because of its improved sensitivity to proof mass deflections, is capable of measuring the smaller deflections caused by off-resonance magnetic signals. The readout electronics and the subsequent signal processing may be designed with a frequency compensating transfer function that amplifies the off-resonance response and thereby allows the magnetometer system 400 to operate with low noise not only at the resonance frequency, but over a range of frequencies up to approximately the resonance frequency. The frequency compensating transfer function takes into account the peak in the sensor response due to the mechanical resonance of the resonant structure 214. The transfer function thereby makes the response of the system 400 to magnetic fluctuations more uniform as a function of frequency, or flatter, below the resonance frequency.

Figure 6A:
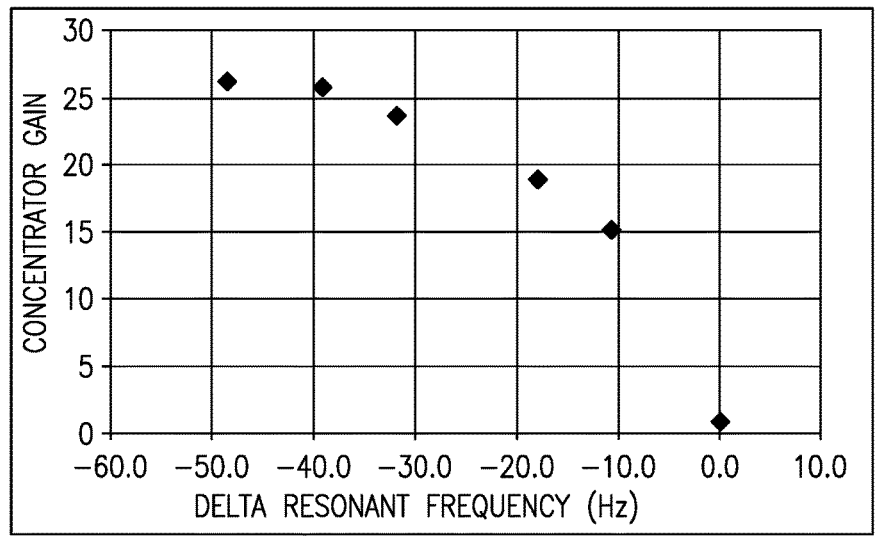
FIG. 6A is a graph showing measured values of the concentrator gain of an example of the magnetometer sensor of FIG. 2, as a function of the change in resonance frequency caused by varying the distance between the concentrator and the sensor magnet.

Referring to FIG. 6A, to increase the off-resonance scale factor, including the static scale factor, of magnetometer systems 400 in broadband operation, the concentrator gain may be increased. For example, decreasing the distance between the poles 422 of the flux concentrator 420 increases the concentrator gain, and thereby the scale factor. FIG. 6A illustrates the variation of concentrator gain caused by changing the air gap distance between the poles 422 of a flux concentrator 420 and the magnet 240 of an embodiment of the out-of-plane magnetometer sensor 200 of FIG. 2. This air gap distance is known as the concentrator gap. The resonant structure 214 associated with the measurements in FIG. 6A has a resonance frequency of approximately 450 Hz in the absence of a flux concentrator 420. The delta resonant frequency is the difference between 450 Hz and the resonance frequency obtained with a flux concentrator 420, at decreasing values of concentrator gap. While FIG. 6A shows concentrator gain as a function of delta resonant frequency, both of those variables are functions of the concentrator gap. Smaller values of concentrator gap result in lower resonance frequency and increased concentrator gain, as shown in FIG. 6A.

Figure 6B:
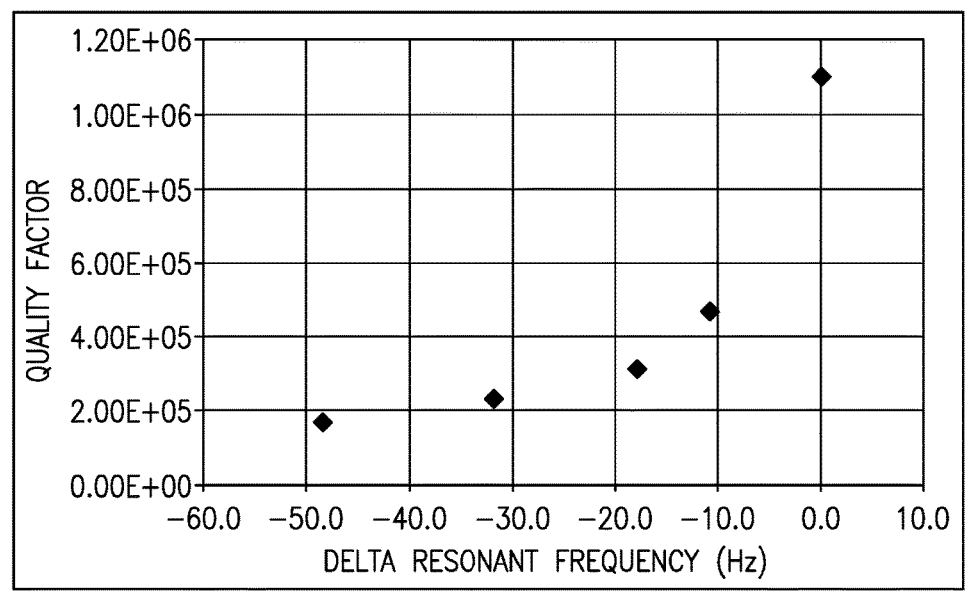
FIG. 6B is a graph showing measured values of the quality factor of the magnetometer sensor associated with FIG. 6A, as a function of the change in resonance frequency caused by varying the distance between the concentrator and the sensor magnet.

Similarly, FIG. 6B illustrates the relationship between quality factor and delta resonant frequency as concentrator gap is varied among the same values as in FIG. 6A, for the same out-of-plane magnetometer sensor 200. Smaller values of concentrator gap result in lower resonance frequency and reduced quality factor.

By adjusting the concentrator gap of a magnetometer system 400 operated in broadband sensing mode, it is possible to achieve an optimal combination of scale factor and resolution over an extended frequency band. Decreasing the concentrator gap increases the concentrator gain, and consequently the off-resonance scale factor, but also reduces the spacing between the concentrator material and the permanent magnet 240, which produces greater eddy current loss and reduced Q, resulting in greater Brownian noise and poorer resolution. Preferably, in broadband sensing mode the concentrator gap is chosen to maximize the concentrator gain, subject to the constraint that the input-referred Brownian noise of the sensor 200 or 300 stays below the input-referred noise of the readout system 500. In embodiments, the scale factor may be maximized by designing the magnetometer system 400 with as small a concentrator gap as mechanically feasible, thereby increasing the input-referred value of the sensor Brownian noise until it approaches that of the readout noise. Because the readout noise at low frequencies is typically greater than the sensor Brownian noise at the minimum feasible concentrator gap, the two input-referred noise values may not equalize at the maximum achievable concentrator gain. For the same reason, the increased Brownian noise that results from smaller values of concentrator gap typically does not limit the resolution of the magnetometer system 400 operated in broadband mode. In embodiments, the concentrator gap may be reduced to 50 µm to obtain an optimal, or nearly optimal, combination broadband scale factor and resolution for a typical level of input-referred readout noise.

The ability to adjust the resonance frequency of a resonant structure 214 by changing the concentrator gap allows the exemplary magnetometer system 400 to be designed with greater mechanical ruggedness at any particular resonance frequency. In one embodiment, the magnetometer system 400 may be designed with a value of the concentrator gap equal to $d_0$, yielding a resonance frequency of $\omega_0$ while in a second embodiment, the magnetometer system 400 may be designed with a concentrator gap narrower than $d_0$, but in all other aspects the same as the first embodiment. The second embodiment would have a resonance frequency equal to $\omega_0 - \Delta\omega$, lower than that of the first embodiment. In a third embodiment, the magnetometer system 400 may be designed with stiffer flexures 220, resulting in a higher resonance frequency, but in all other aspects the same as the second embodiment. For example, the flexures 220 may be designed with a stiffness that yields a resonance frequency of $\omega_0$, equal to that of the first embodiment. Stiffer flexures 220 are thicker and better able to withstand high accelerations due to inertial as well as magnetic forces. Thus, the third embodiment achieves greater mechanical ruggedness than the first by using stiffer flexures 220 in combination with a smaller concentrator gap, without changing the resonance frequency. In this manner, the concentrator gap may be chosen so as to increase the mechanical ruggedness of the resonant structure 214, subject to the constraint that the resonance frequency equal a specific value.

The foregoing features of the invention may be employed to design a magnetometer system 400 that is suitable for broadband operation. The design process may begin with operational requirements that identify signals of interest in a particular frequency range, the extent of which determines the required bandwidth of the system 400. For example, a bandwidth of 5 Hz may be required to measure signals of interest in a range from 0 Hz to 0.5 Hz. The required bandwidth determines a design resonance frequency, which, in embodiments, approximately equals the required bandwidth. After an initial design step, a resonant structure 214 may achieve the design resonance frequency. A magnetic concentrator 420 may then be combined with the resonant structure 214, and the concentrator gap reduced to maximize the off-resonance scale factor of the magnetometer system 400. The narrow concentrator gap reduces the resonance frequency below the design resonance frequency. The flexures 220 in the resonant structure 214 may then be stiffened so as to restore it to the design resonance frequency. In this manner, the magnetometer system 400 may be designed to achieve the required bandwidth while also maximizing its off-resonance scale factor and mechanical ruggedness.

Figure 7:
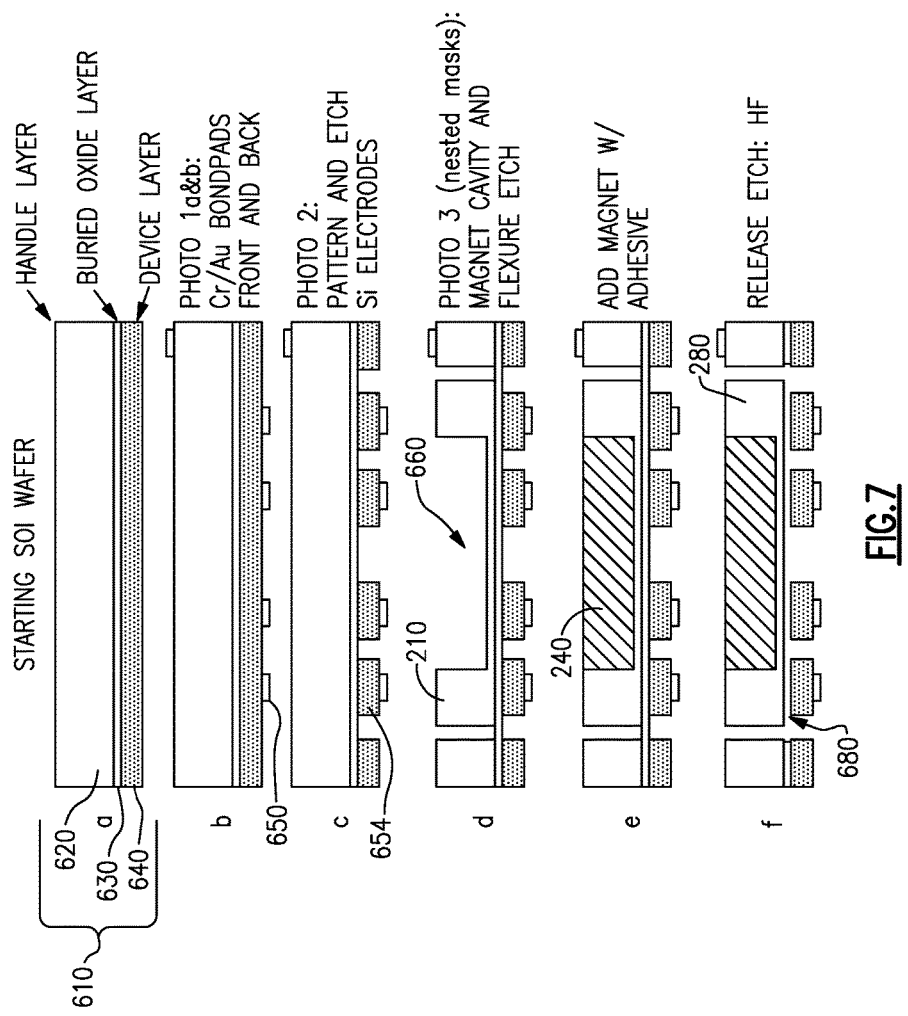
FIG. 7 illustrates the steps of an exemplary fabrication method for creating an out-of-plane magnetometer sensor with capacitive pickoffs.

Examples of the resonant microstructure 214 described herein may be conveniently fabricated by adaptations of techniques that are well known in the art of MEMS device microfabrication. Referring to FIG. 7, an exemplary method for fabricating an out-of-plane magnetometer sensor 200 having capacitive pickoffs begins with a silicon-on-insulator wafer 610 comprising a handle layer 620 made of silicon, a buried oxide layer 630 and a device layer 640 of silicon. Multiple sensors 200 may be fabricated simultaneously on the wafer 610 and later singulated. The sensor body 210 and flexures 220 are fabricated from the handle layer 620, while the capacitive pickoff electrodes 330 are fabricated from the device layer 640. Metal contact pads 650, for example gold or copper pads, are formed on the external surfaces of the silicon layers 620 and 640 using photolithographic techniques. Lands 654 may then be etched in the device layer 640 to form the capacitive pickoff electrodes. Preferably, the lands 654 are formed with holes to facilitate a later release step.

The handle layer 620 may then be etched to create a sensor body 210 and flexures 220. Nested masks may be used to form a cavity 660 in the body 210 to contain a permanent magnet 240. The nested mask step uses an oxide mask, with openings for both the cavity 660 and the flexures 220, in combination with an overlying photoresist mask, with openings only for the flexures 220. After etching to create flexures 220 and a body 210 of the required thickness, the photoresist mask is removed. The cavity 660 may then be etched to the required depth. In this manner, it is possible to leave a suitable thickness of silicon substrate between the magnet 240 and the oxide layer 630. The sensors may then be singulated and a permanent magnet 240 adhered or press-fit in the cavity 660 of each sensor 200. The proof mass 280 may then be released from the substrate using a hexafluoride etch, which removes the oxide layer 630 beneath the proof mass 280 to create a clearance space 680. The sensor 200 may then be wire bonded to the lead frame of a microelectronic package.

It will be appreciated that the foregoing fabrication method may employ an alternate substrate in place of silicon, for example, gallium arsenide, silicon carbide or another suitable material. It will further be appreciated that an in-plane magnetometer sensor 300 may be fabricated by a method similar to the exemplary fabrication method described with respect to an out-of-plane sensor 200. A method for fabricating an in-plane sensor 300 may omit several steps, since only one metal layer is necessary, and nested masks are not used in the process.

Embodiments of the invention disclosed herein offer a variety of advantages, including improved gain and resolution, and reduced size, weight and power, relative to conventional magnetometer sensors. Some of the advantages will be explained in the following paragraphs, and others will be apparent from the foregoing description of embodiments.

Figure 8:
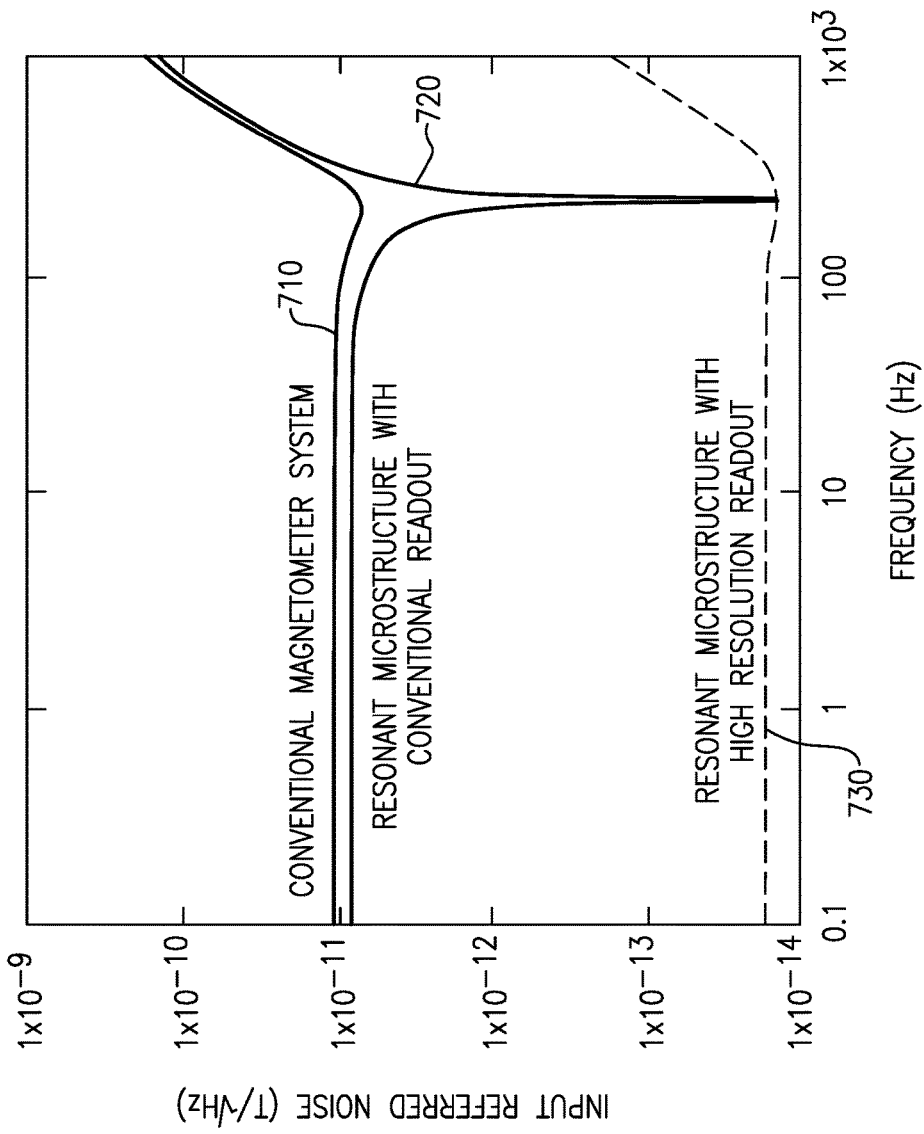
FIG. 8 is a graph of the input-referred noise of a conventional magnetometer and that of a magnetometer embodying features of the present invention.

The magnetometers 400 disclosed herein are capable of two advantageous modes of operation, ultra-low noise resonant sensing and broadband sensing. In resonant operation, the transfer function of the sensor 200 or 300 is proportional to Q in a narrow bandwidth that may be on the order of 1-10 mHz around the resonance frequency. As a result, the scale factor in resonant operation is multiplied by the Q factor, which may exceed 200,000, relative to nonresonant operation. Moreover, resonant operation improves the resolution of the magnetometer sensor 200 or 300. The resolution of any magnetometer sensor is limited by the total input-referred noise from all sources, with important noise contributions from the Brownian motion of the proof mass 280 and from the readout system 440 or 500, as described above. Referring to FIG. 8, the input-referred noise 710 of a low-noise conventional magnetometer system may approach 10 pT/√Hz at frequencies below several hundred Hertz. Embodiments of the resonant magnetometer sensor 200 or 300 incorporate a high Q resonant microstructure 214, which reduces the input-referred noise 720 of the magnetometer system 400 almost to 10 fT/√Hz in the resonant band. Among other advantages, improved magnetometer resolution relaxes the low-noise performance required of the readout system 440. A magnetometer 400 operated in resonant mode may be used with a lower resolution readout 440 without unacceptably degrading the resolution of the magnetometer system 400.

Embodiments of a magnetometer 400 operated in broadband mode may employ a high Q resonant microstructure 214 in cooperation with a high resolution optical readout system 500, and apply a frequency compensating transfer function during the processing of the readout signal. Such embodiments may achieve an input-referred noise 730 over a broad range of frequencies equal to that achieved in the resonant band. In this manner, the input-referred noise 730 may be reduced almost to 10 fT/√Hz over a range from 100 mHz to approximately the resonance frequency.

The high intrinsic scale factor of a resonant MEMS magnetometer allows it to achieve resolution equivalent to that of a SQUID magnetometer, but with orders of magnitude lower size, weight and power. In applications where those attributes are critical, embodiments of a resonant MEMS magnetometer can replace a sensor, an analog to digital converter, and a digital processor with a single integrated device that has a high scale factor and resolution.

Referring to FIG. 9, a specific embodiment of a magnetometer 800 comprises an integrated mounting plate 810, which supports the optical readout components and the integrated magnetometer sensor 820, surrounded by top and bottom covers 830 and 840 and an optics cover 850. An optional DC null solenoid 470 is not shown, but would be wound around the assembled covers 830, 840 and 850, with its axis intersecting the sensor 820 and aligned with the sensitive direction of the sensor 820. Suitable dimensions of the top and bottom covers 830 and 840 are 10 cm wide by 40 cm long. A suitable height of the assembled magnetometer 800 is 15 cm, excluding any DC null solenoid 470.

The laser source 442 is oriented so that its laser beam 520 shines through an opening in the integrated mounting plate 810 and illuminates the magnetometer sensor 200 beneath it. The mirror 250 of the magnetometer sensor 200 reflects the laser beam 520 toward the readout mirror 530. The readout mirror 530 is oriented so that the reflected laser beam 520 is directed toward a knife edge detector 570. As described above with reference to FIG. 5A, the laser beam 520 illuminates the apex of the knife edge prism 526 that forms part of the knife edge detector 570 and produces a current signal proportional to the external magnetic flux density 140.

Referring to FIG. 10A, a specific embodiment of an optional cryogenic cooling system 460 for cooling a magnetometer sensor 200 derives from an 80T cryostat, manufactured by Janis Research Corporation. The 80T cryostat is modified so that only nonmagnetic and dielectric or weakly conductive materials are located in the vicinity of the sensor 200. Any magnetic or conductive components are located in the exemplary cryostat tower 860, preferably at a distance of at least 15 cm from the sensor 200. The cryostat tower 860 comprises a liquid helium reservoir 868 inside a liquid nitrogen reservoir 864, both reservoirs made of stainless steel, a sample tube 870, and gas valves 862 leading to vacuum pumps, which are not shown in FIG. 10A. The sample tube 870 extends through the cryogen reservoirs 864 and 868 and contains the sensor 200 in its lower end 880.

Surrounding the lower end 880 of the sample tube 870 is a Pyrex vacuum tube 872, which is evacuated through a gas valve 862. The Pyrex tube 872 seals to the liquid nitrogen reservoir 864 using an O-ring seal 874 suitable for use with cryogenic systems. The sample tube 870 may also be evacuated, and seals to the liquid nitrogen reservoir using an indium seal 876.

Referring to FIG. 10B, the lower end 880 of the sample tube 870 contains the magnetometer sensor 200, attached to a holder 884 made of Delrin. Near the magnetometer sensor 200 is an optional temperature sensor 882. Extending to the bottom of the sample tube 870 is a nonmetallic fill tube 890 that carries a liquid cryogen, comprising either liquid helium or liquid nitrogen, to the bottom of the sample tube 870. The nonmetallic fill tube may be made of Teflon or another suitable plastic. The liquid cryogen fills the bottom of the sample tube 870 to a fill level 878, and preferably covers an amount of quartz wool 888 contained there. All of the components in and around the lower end 880 of the sample tube 870 are made of nonmagnetic and nonconductive materials. The quartz sample tube 870 and the Pyrex vacuum tube 872 are transparent to the laser light used by a high resolution optical readout system 500, described above with reference to FIGS. 5 and 5A. As a result, the cooling system 460 is compatible with the optical readout system 500, and the two systems may advantageously be used together.

The cooling system 460 operates by continuously supplying liquid cryogen to the bottom of the sample tube 870, where it diffuses in the quartz wool 888. The liquid cryogen evaporates, creating a helium or nitrogen cooling gas that travels upward in the sample tube 870, passing the sensor 200 and cooling it. To achieve the lowest temperatures, the sensor 200 may first be cooled using liquid nitrogen, and then further cooled using liquid helium. Realizations of the specific embodiment illustrated in FIGS. 10A and 10I have achieved cooling gas temperatures of 120° K when the sample tube 870 is at atmospheric pressure and 64° K when the sample tube 870 is evacuated to a near vacuum.

Figure 11:
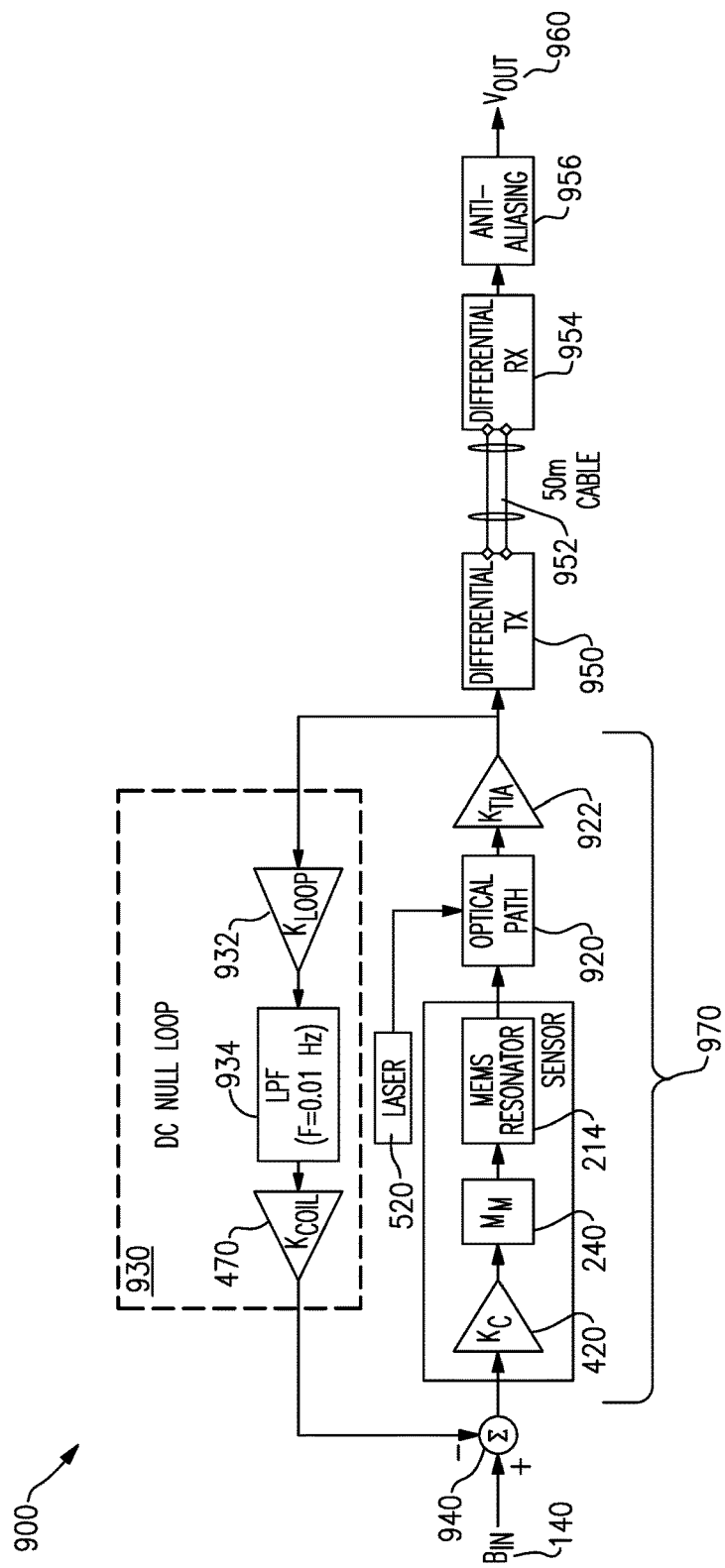
FIG. 11 is a schematic diagram of a specific embodiment of a system incorporating the magnetometer of FIG. 9.

Referring to FIG. 11, a specific embodiment of a resonant magnetometer system 900 comprises mechanical, optical, and electrical devices that cooperate to transform a component of an external magnetic flux density 140 above a threshold frequency into an output voltage 960 proportional to the magnitude of that component. The output of the summing node 940 represents the superposition of the external magnetic field 140 and the field caused by the null solenoid 470, both of which fields are present in the sensor volume. The inputs to the summing node 940 are shown with opposite signs because the null solenoid 470 produces a field that tends to cancel the external field 140, as further described above with reference to FIG. 4.

The total field in the sensor volume is multiplied by the gain of the flux concentrator 420. Referring to FIGS. 2 and 11, the multiplied field creates a torque 274 on the proof mass 280 of the resonant structure 214 in proportion to the magnetization 272 of the permanent magnet 240 that is part of the proof mass 280. The displacement of the proof mass 280 in response to the torque 274 alters the path 920 of the laser beam 520 of a high resolution optical readout 500. The change in the optical path 920 is sensed by a knife edge detector 570. The output current of the knife edge detector 570 is transformed into a proportional voltage by the transimpedance amplifier (TIA) 922. The output of the TIA 922 is applied to a differential cable driver 950, which drives a length of shielded, twisted pair cable 952 to a data acquisition system. The cable 952 is connected to a differential line receiver 954, which produces a single-ended voltage signal. That signal is filtered by a low pass, anti-aliasing filter 956 to produce an output voltage 960 conditioned for periodic sampling by the data acquisition system.

The output of the TIA 922 is also applied to a DC null feedback loop 930 that reduces the overall gain of the system 900 at low frequencies and thereby attenuates the otherwise overwhelming contribution of the quasi-static earth's field to the output voltage 960. An amplifier 932 and a low pass filter 934, which are designed using techniques well known in the art of electronics, condition the TIA output to create an excitation current for the DC null solenoid 470. The TIA 922, amplifier 932 and low pass filter 934 together form a signal conditioner that amplifies and filters the output of the knife edge detector 570 before it is applied to the DC null solenoid 470. The excitation current through the solenoid 470, creates a magnetic field opposing the earth's field in the sensor volume. The 3 dB rolloff frequency of the low pass filter 934 is chosen above the frequency of the largest components of the earth's quasi-static magnetic field, but below the characteristic frequency of signals of interest. A rolloff frequency of 0.01 Hz is suitable for important applications. By nulling the quasi-static earth's field, the dynamic range required of the knife edge detector 570 is greatly reduced.

The DC null feedback loop 930 is able to attenuate magnetic signals below the rolloff frequency from any external source, such as lightning or the cryogenic cooling system 460, not only the quasi-static earth's field. The feedback loop 930 also beneficially attenuates noise from certain sources within the magnetometer system 900 by operation of negative feedback. It is well known in the art of electronic circuits that for values of loop gain much greater than unity, the output of a circuit incorporating negative feedback is independent of in the properties of the feedforward signal path 970. Embodiments of the magnetometer system 900 are capable of loop gain much greater than unity below the rolloff frequency because of their high scale factor, which equals the gain of the feedforward path 970 and is a factor in the loop gain.

In the exemplary magnetometer system 900, the feedforward path 970 includes the flux concentrator 420, the permanent magnet 240, the resonant structure 214, the knife edge detector 570 in the optical path 920 and the TIA 922. The properties of the components in the feedforward path 970 tend not to affect the output voltage 960. In particular, additive, independent noise below the rolloff frequency that is introduced downstream of the high gain components in the feedforward path 970 is highly attenuated relative to the output-referred external magnetic flux density 140. For example, low frequency noise from the knife edge detector 570 and the TIA 922 can be attenuated by the DC null feedback loop 930. In this manner, the DC null feedback loop 930 attenuates noise from a variety of sources, both internal and external to the magnetometer system 900, in addition to the earth's magnetic field.

On the other hand, noise added to the input magnetic flux density 140 by the feedback loop 930 itself, for example by the solenoid coil 470, is not attenuated. For this reason, the DC null feedback loop 930 can itself add noise to the output voltage 960. The noise of the DC null loop 930 may be reduced by using techniques well known in the art of inductor design to ensure that the DC null solenoid 470 has its electrical resonance at a frequency well below the characteristic frequency of signals of interest. In this manner, the feedback loop 930 reduces Johnson and amplifier noise that would otherwise be added to the output voltage 960.

It will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors, or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

While particular embodiments of the present invention have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. A sensor for magnetic fields comprising:
   a micromachined body;
   at least one magnet attached to the body and, together with the body, forming a proof mass;
   one or more micromachined flexures mechanically connected between the body and a substrate, wherein the proof mass and the flexures form a resonant structure having a high quality factor and a resonance frequency;
   two pieces of magnetically permeable material, located on opposite sides of the proof mass, each at a separation distance from the proof mass, and configured to concentrate magnetic flux at a location of the proof mass;
   a high resolution readout system having a level of input-referred readout noise, configured to provide an electrical output as a function of displacement of the proof mass;
   a processor operatively connected to the readout system and having a frequency compensating transfer function; and
   a solenoid coil surrounding the proof mass and configured as part of a feedback loop to null a magnetic field at the location of the proof mass and at frequencies below a threshold frequency.

2. The sensor of claim 1, wherein the separation distance is chosen so as to allow the resonant structure to be designed with increased mechanical ruggedness, subject to the constraint that the resonance frequency has a specific value.

3. The sensor of claim 1, further comprising a vacuum package that encloses the resonant structure.

4. The sensor of claim 1, wherein the high resolution readout system comprises:
   an optically reflective surface belonging to the proof mass;
   a laser beam configured to illuminate the optically reflective surface of the proof mass and reflect from it, creating a reflected laser beam;
   a prism configured to split the reflected laser beam into two split beams, so that the difference in power between the split beams is a function of the displacement of the proof mass; and
   an optical detector configured to measure the difference in power between the split beams.

5. The sensor of claim 4, wherein the optical detector is a bilateral split detector configured so that each split beam impinges on a different half of the split detector.

6. The sensor of claim 4, wherein the optical detector is a knife edge detector.

7. The sensor of claim 4, further comprising a vacuum package that encloses the resonant structure.

8. The sensor of claim 1, wherein an electrical resonance frequency of the solenoid coil is chosen to minimize noise introduced by the solenoid coil into a measurement of the magnetic field.

9. A sensor for magnetic fields comprising:
   a micromachined body;
   at least one magnet attached to the body and, together with the body, forming a proof mass;
   one or more micromachined flexures mechanically connected between the body and a substrate, wherein the proof mass and the flexures form a resonant structure having a high quality factor and a resonance frequency;
   two pieces of magnetically permeable material, located on opposite sides of the proof mass, each at a separation distance from the proof mass, and configured to concentrate magnetic flux at a location of the roof mass;
   a high resolution readout system having a level of input-referred readout noise, configured to provide an electrical output as a function of displacement of the proof mass, wherein the separation distance is chosen so as to maximize concentrator gain, subject to a constraint that an input-referred noise due to Brownian motion of the proof mass is below the level of input-referred readout noise; and
   a processor operatively connected to the readout system and having a frequency compensating transfer function.

10. The sensor of claim 9, further comprising a vacuum package that encloses the resonant structure.

11. The sensor of claim 9, wherein the high resolution readout system comprises:
    an optically reflective surface belonging to the proof mass;
    a laser beam configured to illuminate the optically reflective surface of the proof mass and reflect from it, creating a reflected laser beam;
    a prism configured to split the reflected laser beam into two split beams, so that the difference in power between the split beams is a function of the displacement of the proof mass; and
    an optical detector configured to measure the difference in power between the split beams.

12. The sensor of claim 11, wherein the optical detector is a bilateral split detector configured so that each split beam impinges on a different half of the split detector.

13. The sensor of claim 11, wherein the optical detector is a knife edge detector.

14. The sensor of claim 11, further comprising a vacuum package that encloses the resonant structure.

15. The sensor of claim 9, further comprising a solenoid coil surrounding the proof mass and configured as part of a feedback loop to null a magnetic field at the location of the proof mass and at frequencies below a threshold frequency.

16. The sensor of claim 15, wherein an electrical resonance frequency of the solenoid coil is chosen to minimize noise introduced by the solenoid coil into a measurement of the magnetic field.

17. A sensor for magnetic fields comprising:
    a micromachined body;
    at least one magnet attached to the body and, together with the body, forming a proof mass;
    one or more micromachined flexures mechanically connected between the body and a substrate, wherein the proof mass and the flexures form a resonant structure having a high quality factor and a resonance frequency;
    two pieces of magnetically permeable material, located on opposite sides of the proof mass, each at a separation distance from the proof mass, and configured to concentrate magnetic flux at a location of the proof mass;
    a high resolution readout system having a level of input-referred readout noise, configured to provide an electrical output as a function of displacement of the proof mass;
    a processor operatively connected to the readout system and having a frequency compensating transfer function, wherein the high resolution readout system comprises:
    an optically reflective surface belonging to the proof mass,
    a laser beam configured to illuminate the optically reflective surface of the proof mass and reflect from it, creating a reflected laser beam, a prism configured to split the reflected laser beam into two split beams, so that the difference in power between the split beams is a function of the displacement of the proof mass, and an optical detector configured to measure the difference in power between the split beams; and a cryogenic cooling system, configured to cool the resonant structure and further configured so that any magnetic or conductive component of the cooling system is located at a sufficient distance from the resonant structure that the component does not increase noise in the electrical output.

18. The sensor of claim 17, wherein the magnet comprises a high critical temperature superconducting material.

19. The sensor of claim 17, wherein the separation distance is chosen so as to allow the resonant structure to be designed with increased mechanical ruggedness, subject to the constraint that the resonance frequency has a specific value.

20. The sensor of claim 17, further comprising a vacuum package that encloses the resonant structure.

21. The sensor of claim 17, wherein the optical detector is a bilateral split detector configured to so that each split beam impinges on a different half of the split detector.

22. The sensor of claim 17, wherein the optical detector is a knife edge detector.

23. The sensor of claim 22, further comprising a vacuum package that encloses the resonant structure.

24. The sensor of claim 17, further comprising a solenoid coil surrounding the proof mass and configured as part of a feedback loop to null a magnetic field at the location of the proof mass and at frequencies below a threshold frequency.

25. The sensor of claim 24, wherein the electrical resonance frequency of the solenoid coil is chosen to minimize noise introduced by the solenoid coil into a measurement of the magnetic field.

26. A method for measuring a magnetic field comprising:
providing a resonant structure having a resonance frequency;
attaching at least one magnet to the resonant structure to form a proof mass, wherein the proof mass is configured to move in response to the force of a magnetic field acting on the magnet;
providing two pieces of magnetically permeable material, located on opposite sides of the proof mass, each at a separation distance from the proof mass, and configured so as to concentrate magnetic flux at a location of the roof mass;
providing a solenoid coil surrounding the proof mass and configured as part of an electrical feedback loop;
nulling the magnetic field at the location of the proof mass and at frequencies below a threshold frequency;
amplifying the motion of the proof mass by operation of a mechanical resonance of the resonant structure;
measuring the displacement of the proof mass; and
computing from the displacement of the proof mass a magnitude of a component of the magnetic field at the resonance frequency.

27. The method of claim 26, further comprising:
providing a modulating signal, wherein the product of the modulating signal and a waveform of the magnetic field produces a frequency component at the resonance frequency; and
modulating the magnetic flux at the location of the proof mass as a function of the modulating signal.

\* \* \* \* \*

UNITED STATES PATENT AND TRADEMARK OFFICE
CERTIFICATE OF CORRECTION

PATENT NO. : 10,018,686 B1  
APPLICATION NO. : 14/919527  
DATED : July 31, 2018  
INVENTOR(S) : James A. Bickford et al.

Page 1 of 1

It is certified that error appears in the above-identified patent and that said Letters Patent is hereby corrected as shown below:

In the Claims

Column 24, Line 2, delete "roof" and insert -- proof --.

Column 26, Line 16, delete "roof" and insert -- proof --.

Signed and Sealed this
Second Day of October, 2018

Andrei Iancu
*Director of the United States Patent and Trademark Office*